(12) United States Patent
Clara et al.

(10) Patent No.: US 11,637,560 B2
(45) Date of Patent: Apr. 25, 2023

(54) SEGMENTED DIGITAL-TO-ANALOG CONVERTER WITH SUBTRACTIVE DITHER

(71) Applicant: Intel Corporation, Santa Clara, CA (US)

(72) Inventors: Martin Clara, Santa Clara, CA (US); Daniel Gruber, St. Andrae (AT); Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/455,221

(22) Filed: Nov. 17, 2021

(65) Prior Publication Data

US 2022/0200617 A1    Jun. 23, 2022

(30) Foreign Application Priority Data

Dec. 23, 2020    (EP) .................................... 20216813

(51) Int. Cl.
*H03M 1/20*    (2006.01)
*H03M 1/10*    (2006.01)

(52) U.S. Cl.
CPC .................. *H03M 1/1014* (2013.01)

(58) Field of Classification Search
CPC .... H03M 1/68; H03M 1/0641; H03M 1/0656; H03M 1/1033; H03M 1/1071;

(Continued)

(56) References Cited

U.S. PATENT DOCUMENTS 4,430,642 A * 2/1984 Weigand ................. H03M 1/68
                                                                341/145
4,916,499 A * 4/1990 Kawai ................. H01L 29/8083
                                                                257/E29.313

(Continued)

FOREIGN PATENT DOCUMENTS

JP                227026 A      9/1993

OTHER PUBLICATIONS

Brannon, B. (1995). Overcoming Converter Nonlinearities with Dither, 1995. Analog Devices, Application Note AN-410.

(Continued)

*Primary Examiner* — Linh V Nguyen
(74) *Attorney, Agent, or Firm* — 2SPL Patentanwälte PartG mbB; Yong Beom Hwang

(57) ABSTRACT

A segmented digital-to-analog converter (DAC) includes DAC segments, an overrange DAC, and a dither control circuit. Each DAC segment includes a plurality of DAC cells for generating an analog output signal based on input data to each DAC segment. The overrange DAC generates an analog output signal based on a control signal. The dither control circuit adds a dither to first input data supplied to a higher-order DAC segment, subtract a portion of the dither from second input data supplied to a lower-order DAC segment, and generate the control signal for subtracting a remaining portion of the dither from an output of the segmented DAC in an analog domain. The dither added to the first input data may be one of +1, 0, and −1 and the portion of the dither subtracted from the second input data may be a half of the dither added to the first input data.

19 Claims, 19 Drawing Sheets

(58) Field of Classification Search
CPC ...... H03M 1/066; H03M 1/0639; H03M 1/66; H03M 1/06; H03M 1/0665; H03M 1/745; H03M 1/74; H03M 1/742; H03M 1/109
USPC .......................................... 341/131, 138, 144
See application file for complete search history.

(56) References Cited

U.S. PATENT DOCUMENTS

| | | | | |
|---|---|---|---|---|
| 5,148,163 | A * | 9/1992 | Frindle | H03M 1/0641 341/131 |
| 5,189,418 | A * | 2/1993 | Bartz | H03M 1/0641 341/131 |
| 5,684,482 | A * | 11/1997 | Galton | H03M 1/0668 341/144 |
| 5,963,157 | A * | 10/1999 | Smith | H03M 1/0641 341/131 |
| 6,466,147 | B1 * | 10/2002 | Jensen | H03M 1/0673 341/143 |
| 9,941,897 | B1 * | 4/2018 | Li | H03M 1/201 |
| 10,069,505 | B1 | 9/2018 | Poulton et al. | |
| 10,587,280 | B2 * | 3/2020 | Chen | H03M 1/68 |
| 2005/0093729 | A1 * | 5/2005 | Lin | H03M 1/0641 341/145 |
| 2009/0243904 | A1 * | 10/2009 | Lee | H03M 1/0673 341/144 |
| 2019/0334545 | A1 * | 10/2019 | Quiquempoix | H03M 3/464 |
| 2021/0194492 | A1 * | 6/2021 | Zhao | H03M 1/109 |

OTHER PUBLICATIONS

Clara, M., Klatzer, W., Gruber, D., & Pribyl, W. (2008). A 1.5V 13bit 130-300MS/s Self-calibrated DAC with Active Output Stage and 50MHz Signal Bandwidth in 0.13um CMOS. European Solid-State Circuits Conference, (pp. 262-265).

Clara, M., Klatzer, W., Seger, B., Di Giandomenico, A., & Gori, L. (2007). A 1.5V 200MS/s 13b 25mW DAC with Randomized Nested Background Calibration in 0.13um CMOS. IEEE International Solid-State Circuits Conference, (pp. 250-251).

Doris, K., Van Roermund, A., & Leenaerts, D. (2003). Mismatch-based Timing Errors in Current-Steering DACs. Proceedings of the 2003 International Symposium on Circuits and Systems, (pp. I/977-I/980).

Eielsen, A. A., & Fleming, A. J. (2017). Improving Digital-to-Analog Converter Linearity by Large High-Frequency Dithering. IEEE Transactions on Circuits and Systems—I, vol. 64, No. 6, 2017, 1409-1420.

* cited by examiner

```
%% dither control pn0 = 0
foreach n do:

dc[n] = 1
if PN[n] > 0
   if (pn0 == 0)
      if (d_{LSB}[n] > 2^{82-1}) && (d_{MSB}[n] < 2^{81-1})
         d_{LSB}[n] = d_{LSB}[n]-2^{82-1}
         d_{MSB}[n] = d_{MSB}[n]+1
         dc[n] = 0
         pn0 = 1
      end
   else
      pn0 = 0
end end foreach
```

FIG. 13 ly a segmented DAC with subtractive dither.

SEGMENTED DIGITAL-TO-ANALOG CONVERTER WITH SUBTRACTIVE DITHER

FIELD

Examples relate to a digital-to-analog converter (DAC), more particularly a segmented DAC with subtractive dither.

BACKGROUND

A segmented DAC includes two or more segments of sub-DACs. In a segmented DAC, errors between different DAC segments (i.e. inter-segment errors) cause non-linear distortion. For large (close to full scale) narrowband signals, this error is often perceived as an increase in noise floor, while for broadband signals or heavily backed-off signals (narrowband and broadband), this class of errors tends to manifest itself as non-linear distortion at the converter output. Many modern communication systems (such as a cable modem, wireless base station transmitters, and the like) require a spectrally pure signal even in deep digital back-off.

BRIEF DESCRIPTION OF THE FIGURES

Some examples of apparatuses and/or methods will be described in the following by way of example only, and with reference to the accompanying figures, in which

FIG. 13 shows an example algorithm for digital processing to remove any residual correlation between the dither and the input data in case of 2-segment DAC;

FIG. 15 shows a single-tone spectrum with −0.35% MSB gain error and dither on;

DETAILED DESCRIPTION

Figure 1:
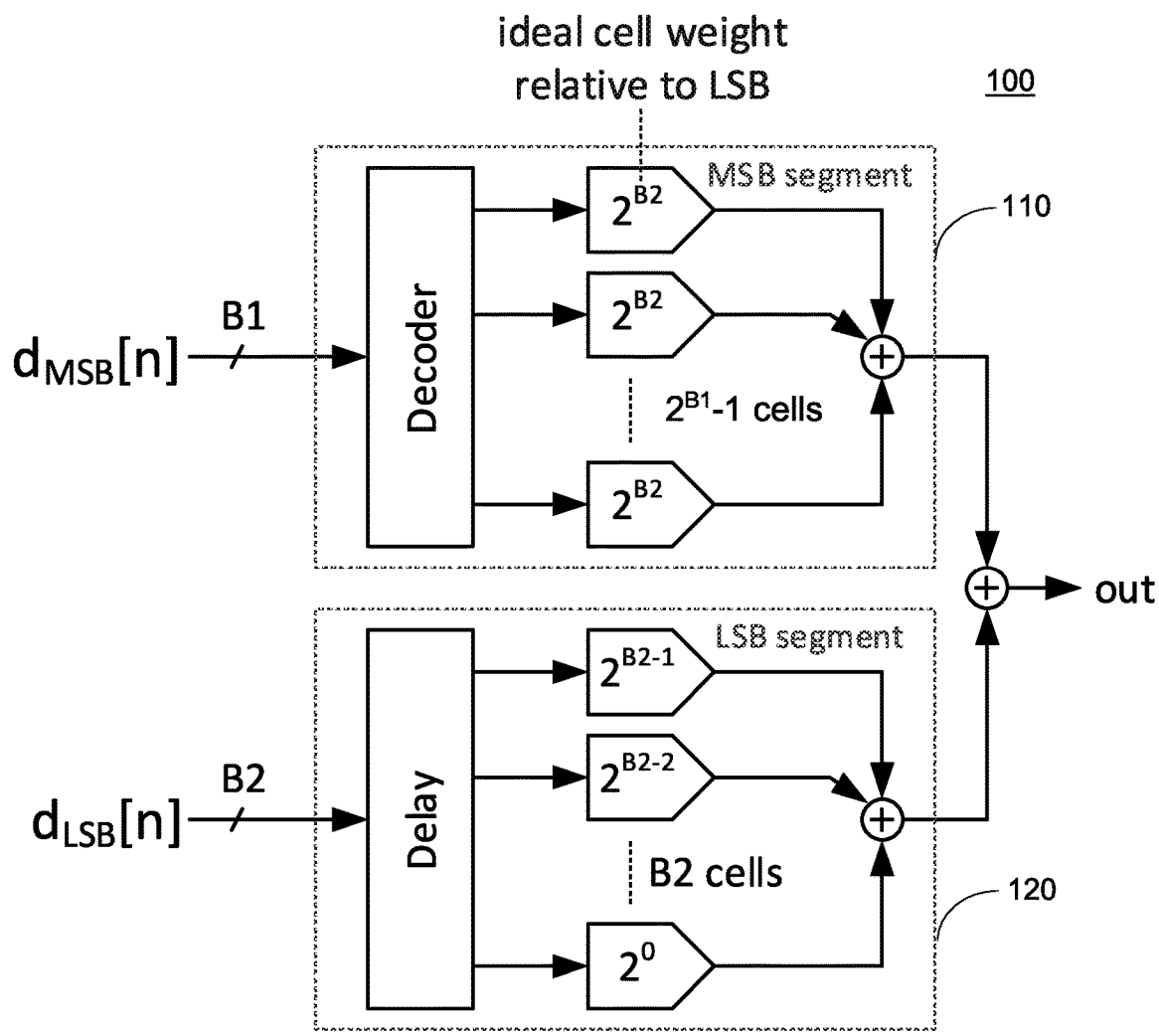
FIG. 1 shows an example 2-segment DAC.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

The inter-segment errors of the segmented DAC are mainly caused by the physical size difference of the DAC cells in different segments, given by the different sizing of circuit elements required by the different DAC cell weights. The inter-segment errors can be related to static errors, e.g. due to cell weight differences or dynamic errors e.g. due to timing or AC-output impedance differences. The mismatch between equal-sized elements within a thermometer-coded segment (i.e. intra-segment mismatch) can be mitigated in a digital domain by special redundant switching sequence algorithms, commonly called dynamic element matching (DEM). The randomizing switching algorithms only operate within a particular segment, and therefore are not able to correct the inter-segment errors.

Even when an element-wise calibration is introduced, which not only adds a significant overhead in analog circuit infrastructure, but generally also leads to potentially complicated questions around the actual process of calibration in the system level context, achieving sufficient accuracy at the DAC segment boundaries often proves difficult, because the DAC cells residing in different segments have to have different physical sizes (i.e. cell weight). Trying to calibrate accurately not only within a single segment, but across segment boundaries leads to the problem of requiring a corresponding number of very accurate scaled reference values, for any type of calibration. Conventionally, the reference cell for (weight) calibration is a copy of a unit DAC cell from either the highest segment (the most-significant bit (MSB) segment), or, in a 3-segment DAC, a particular number of unit reference cells equal to a unit DAC cell from the intermediate segment (the intermediate significant bit (ISB) segment), whose sum matches the unit DAC cell from the next higher (MSB) segment. In practice, these multiple individual unit reference cells will also be affected by mismatch, and should therefore be calibrated amongst themselves, which makes the calibration procedure somewhat complicated. Furthermore, even if the weight matching problem can be solved for sufficiently high sampling rates and signal frequencies, dynamic mismatches (e.g. timing mismatches) may become the dominant error class. All this can make the inter-segment errors the dominant source of non-linearity in a DAC, especially for wideband signal synthesis applications and/or applications demanding a high digital gain range, which in turn directly leads to deep digital back-off situations, irrespective of the actual signal characteristics.

In order to provide adequate matching through mismatch-driven sizing, the individual DAC elements of the full DAC array may be calibrated with special care to eliminate inter-segment gain mismatches. Alternatively, the inter-segment gain error may be measured and corrected digitally by special digital processing of at least one of the segmented input data streams. However, these methods drastically increase the area and power dissipation, and drastically increase calibration complexity and design effort. These methods also require an accurate measurement of the inter-segment errors. Moreover, ΔΣ-modulation of the lower segment data stream may only be applicable if the DAC is operated with a sufficiently high oversampling ratio due to the out-of-band noise generated by this type of digital processing.

FIG. 1 shows an example 2-segment DAC 100. The segmented DAC 100 includes an upper segment (the MSB segment) 110 and a lower segment (the LSB segment) 120. The segmented DAC 100 has a physical resolution of B bits (B=B1+B2). In this example, the lower segment 120 is binary-coded with a resolution of B2 bits. The lower segment 120 includes B2 binary-weighted DAC cells with binary-scaled weights of $2^0$ to $2^{B2-1}$. In this example, the upper segment 110 is thermometer-coded with a resolution of B1 bits. The upper segment 110 includes $2^{B1}-1$ equal-sized DAC cells with the same weight of $2^{B2}$.

The outputs of the lower segment 120 and the upper segment 110 are combined as an output of the segmented DAC. The actual DAC cell scaling within the individual DAC segments 110, 120 is not important for the consideration of inter-segment errors. FIG. 1 shows a two-segment DAC with a thermometer-coded upper segment 110, and a binary-coded lower segment 120, but both segments 110, 120 may be thermometer-coded or binary-coded. The segments 110, 120 may employ an entirely different cell weight arrangement. The occurrence of an inter-segment error means that the DAC cell properties do not scale accurately from one segment to the next. For example, the weight of all DAC cells in a particular segment may be off by the same (relative) amount, although the relative matching of all DAC cells within the same segment may still be accurate.

Figure 2:
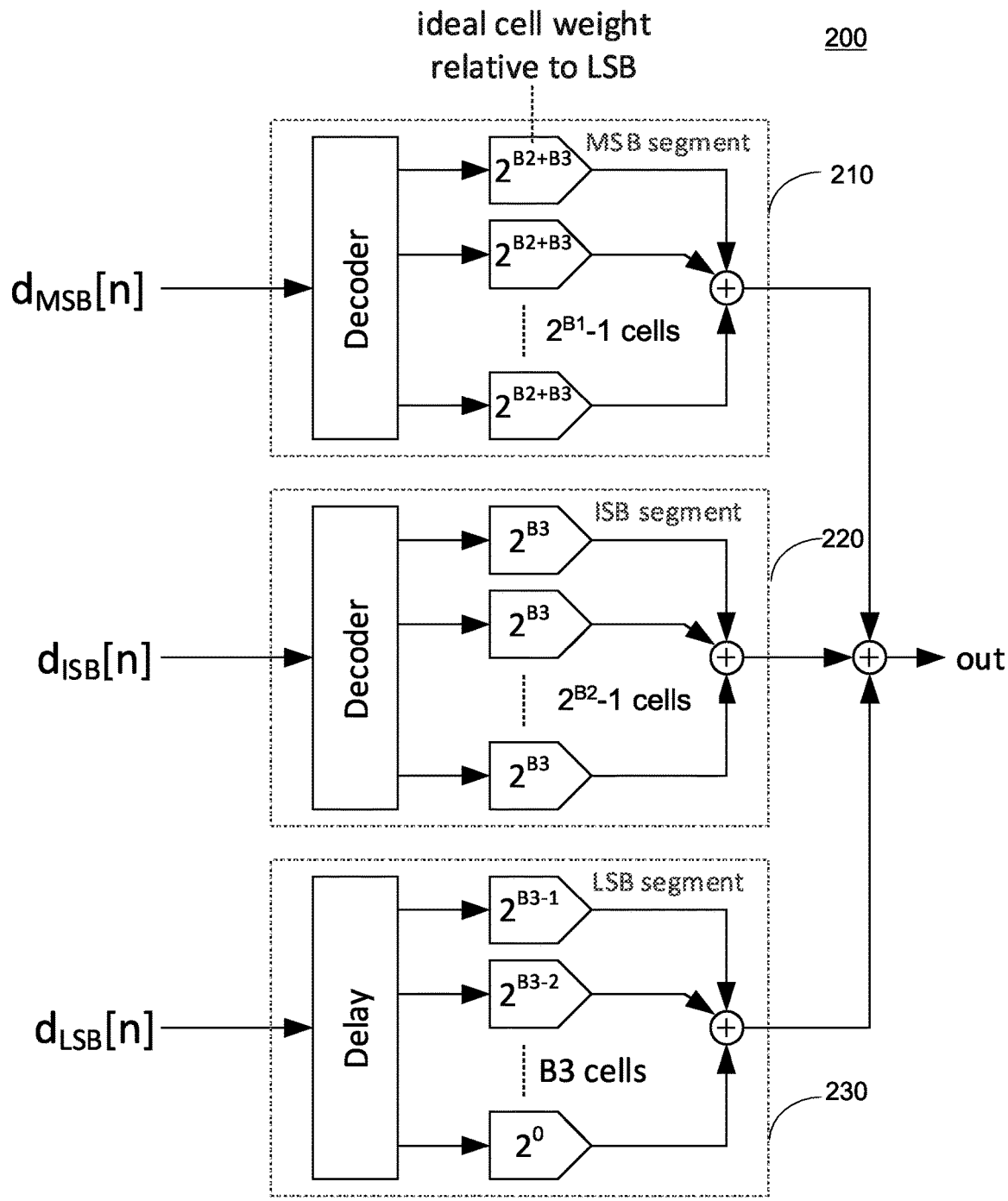
FIG. 2 shows an example 3-segment DAC with two thermometer-coded upper segments and a binary-coded lowest segment.

Segmented DACs may have more than two segments. FIG. 2 shows an example 3-segment DAC 200 with two thermometer-coded upper segments (the MSB segment and the ISB segment) 210, 220 and a binary-coded lowest segment (the LSB segment) 230. Typically, a 3-segment DAC uses thermometer coding for the two uppermost segments (the MSB segment and the ISB segment) 210, 220 and uses binary coding for the lowest segment (the LSB segment) 230, but all or any one of the segments 110, 120, 130 may be thermometer-coded or binary-coded. The segmented DAC 200 in FIG. 2 has a physical resolution of B bits (B=B1+B2+B3). The lower segment (the LSB segment) 230 is binary-coded with a resolution of B3 bits. The middle segment (the ISB segment) 220 is thermometer-coded with a resolution of B2 bits. The upper segment (the MSB segment) 210 is thermometer-coded with a resolution of B1 bits.

The inter-segment errors are not only restricted to an inaccuracy of the cell weights, but also comprise systematic timing errors between segments. More generally, any difference, static or dynamic, in the behavior of DAC cells from different segments (scaled to the respective cell weights) that is observable at the DAC output can be called an inter-segment error. Whether the DAC performance will ultimately be limited by the inter-segment errors depends not only on their relative size compared to other errors, but also on the particular signal being processed.

Figure 3:
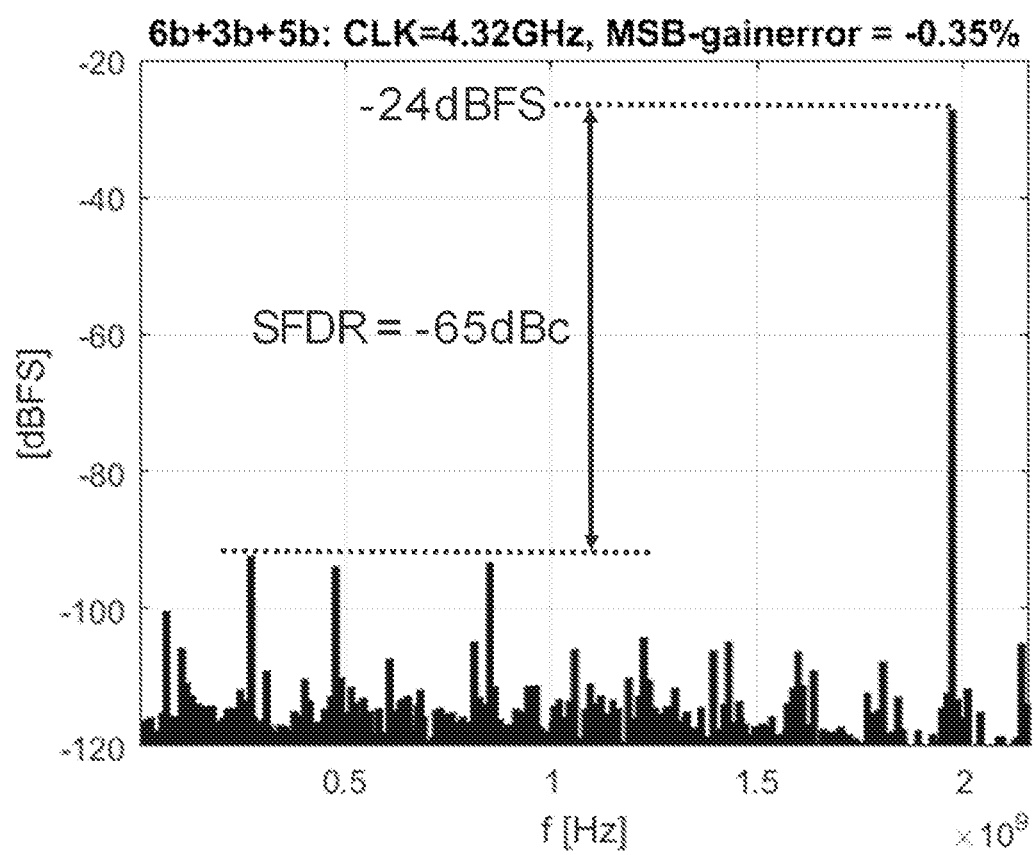
FIG. 3 shows spectrum of a single-tone signal with −0.35% MSB gain error in deep back-off.

FIG. 3 shows spectrum of a single-tone signal with −0.35% MSB gain error in deep back-off. FIG. 3 shows a behavioral simulation example of a high-frequency ($0.91\sqrt{f_{CLK}}/2$) single-tone signal in deep digital back-off (−24 decibels relative to full scale (dBFS)) for the DAC architecture of FIG. 2, with 14 bit overall resolution and segment resolutions, B1=5 bit, B2=3 bit, B3=6 bit, and a (static) gain error of −0.35% in the MSB segment as the only error. This means that the ideal gain factor $2^{B2+B3}$ in FIG. 2, which applies to each DAC cell in the MSB segment, is −0.35% smaller than its nominal value ($2^{5+3}$=256, since it is normalized to the LSB value), while everything else is assumed ideal. The MSB cell weight (equal for all cells in the MSB segment) in this example is therefore (1−0.0035)·256=255.104.

Because only a few MSBs are exercised in this example (5 out of 63), the mismatch between the MSB segment and the lower segments is felt much more severely than for a larger signal, in the sense that for such a small signal the error energy is much more correlated with the signal. Thus, it tends to concentrate in discrete tones and degrades the spurious-free dynamic range (SFDR) relative to the carrier, while for larger signals, the error energy is less correlated with the signal and tends to appear more noise-like.

Figure 4:
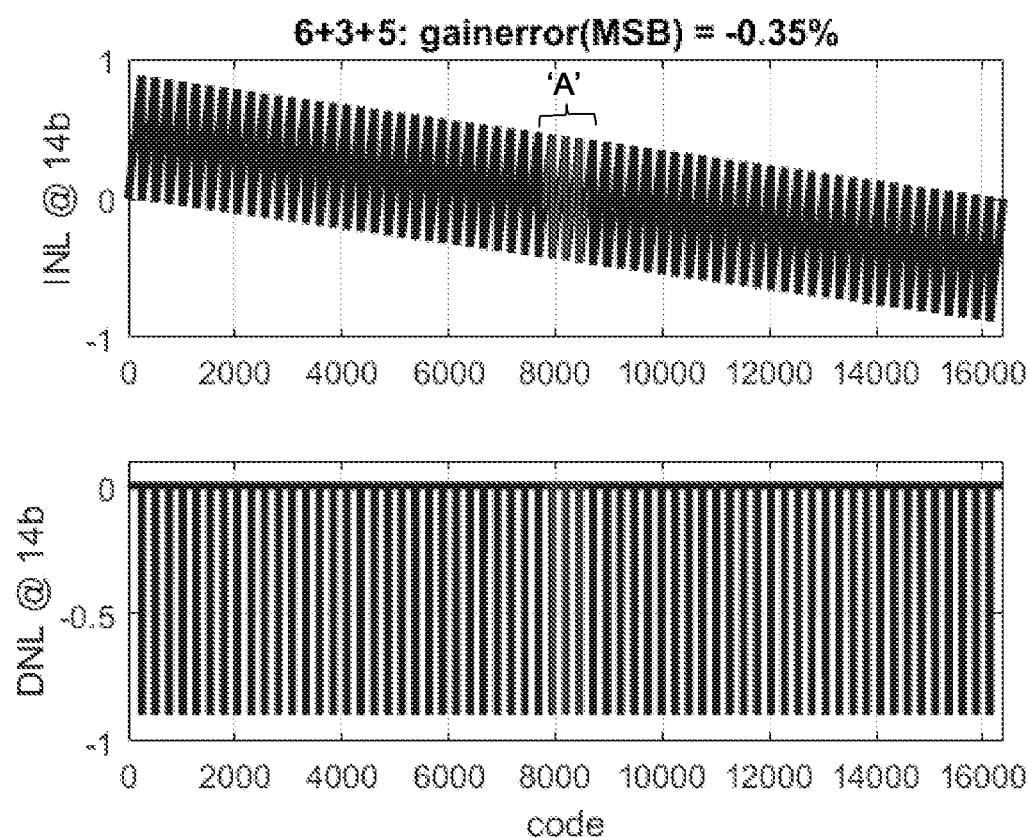
FIG. 4 shows static linearity characteristics of a 14 bit 3-segment DAC with −0.35% MSB gain error.

FIG. 4 shows static linearity characteristics of a 14 bit 3-segment DAC with −0.35% MSB gain error. The maximum differential non-linearity (DNL) is −0.9 LSB and the integral non-linearity (INL) is within −0.9 LSB to +0.9 LSB at the 14-bit level, which in practice would still count as a rather good result for a 14-bit converter. The portion of the static characteristic (indicated "A") is exercised when synthesizing the signal shown in FIG. 3. In case a better SFDR is desired for such a deeply backed-off signal, the segment mismatch should be reduced significantly, at least between the few MSB cells that are actually active and the lower DAC segments.

Figure 5:
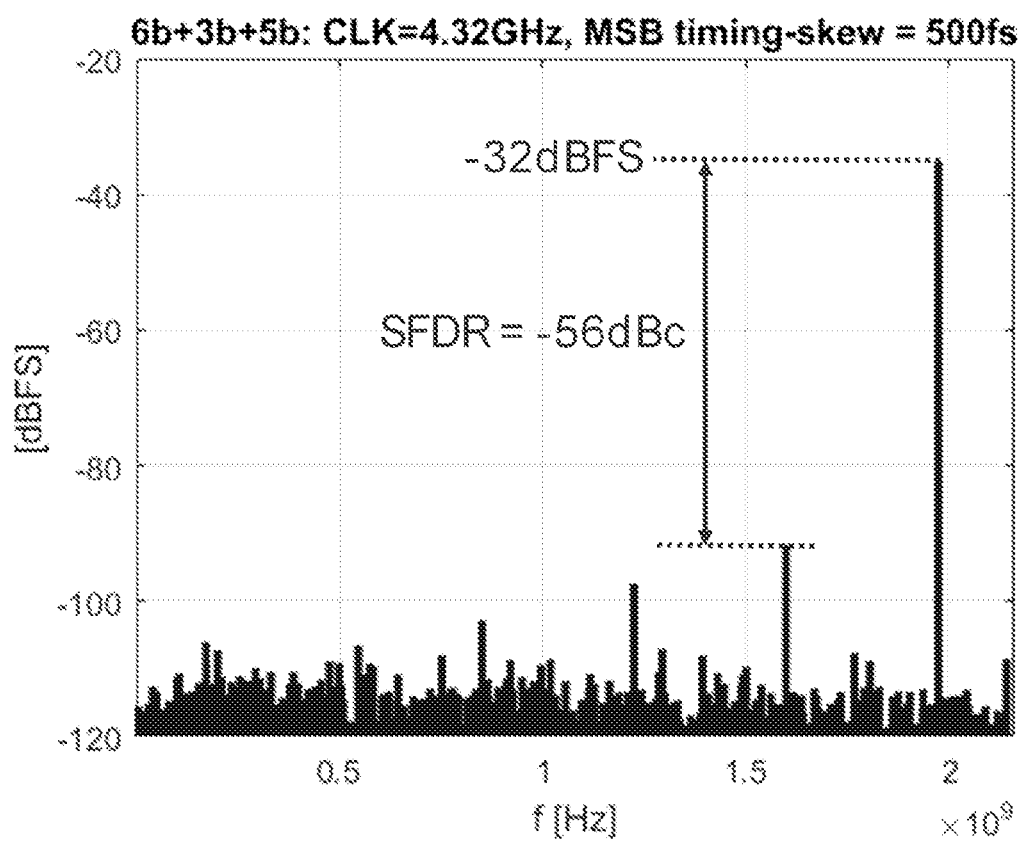
FIG. 5 shows another example of a small, synthesized sine wave subject to inter-segment error in a 3-segment DAC.

FIG. 5 shows another example of a small, synthesized sine wave subject to inter-segment error in a 3-segment DAC. The only error considered in this simulation is a systematic timing skew of +500 fs applied to all DAC cells in the uppermost segment. This means that each MSB cell is updated half a picosecond later than the DAC cells in the lower segments, while everything else is assumed ideal. The systematic 500 fs delay of the MSB-cells can be caused by a timing error in the retiming section, but it can also mean that there is a systematic 500 fs time delay in the summation network for each of the MSB-cells. The observable quantity is that, regardless of the origin of this systematic inter-segment timing mismatch, the output current from an MSB-cell shows up 500 fs later than the output current of DAC-cells from the other segments, leading to nonlinear distortion, because the error is signal dependent.

Examples for a segmented DAC with subtractive dither will be explained hereafter. Dither is an uncorrelated signal that is intentionally injected into an input of a system, such as a DAC or an analog-to-digital converter (ADC). Dithering in a DAC or an ADC is a process of adding a dither to the input signal to the DAC or ADC prior to the conversion. In subtractive dither systems, the dither added at the input is subtracted at the output of the system. In a subtractive dither system, a known (random, uncorrelated with the input signal) quantity is added to the input side of the converter and its effect is subtracted later in the processing chain, such that the dither does not show up (as additive noise) in the digital output signal of the ADC, or in the analog output signal of the DAC.

Dithering has been used to increase the SFDR in multi-stage ADCs, especially for small input signals. The main idea of dithering in an ADC is to randomize the error energy occurring in a multi-stage ADC when the individual ADC stages are not perfectly matched to each other. The application of dither generally improves the linearity (e.g. an SFDR) of the ADC at the expense of a modest increase in noise floor. In certain applications with sufficient oversampling, additive out-of-band dither can be added in both ADC and DAC, although in the case of a DAC this may pose additional restrictions on the anti-alias filtering. True Nyquist converters require subtractive dither, i.e. the dither signal is also subtracted at the output of the converter. This is easily realized in an ADC since the subtraction of the known dither signal is performed in the digital domain. On the other hand, subtractive dither in a DAC requires the accurate subtraction of the dither signal in the analog domain. This may be implemented by introducing redundancy, i.e. additional (overrange) DAC cells.

The segmented DACs with subtractive dither in accordance with the examples disclosed herein do not depend on the architecture of the individual DAC segments or sub-DACs. The segmented DACs with subtractive dither may be used in conjunction with any calibration or special switching arrangement (e.g. DEM) within the individual DAC segments. In other words, the dithering schemes in accordance with the examples disclosed herein are completely transparent to the actual implementation of the DAC segments (sub-DACs), except for the existence of the overrange DAC. Any decoding and eventual special switching arrangement (for thermometer-coded segments) may happen after the digital dither is injected into the (binary) input data. Alternatively, all digital dither operations may also be performed after the decoding of the (binary) input data (in thermometer-coded segments).

Examples are disclosed for segmented DACs with subtractive dither. In examples, instead of trying to measure and correct the inter-segment errors, subtractive dithering is employed to randomize the static and dynamic inter-segment errors. Cross-segment redundancy is introduced by adding an overrange DAC cell(s) in each of the lower segments included in the dithering operation. This redundancy is exploited by selecting different possible DAC cell combinations from different segments for certain allowed input codes, either randomly, or in a predefined way (e.g. following a formula or look-up table, etc.).

Figure 6:
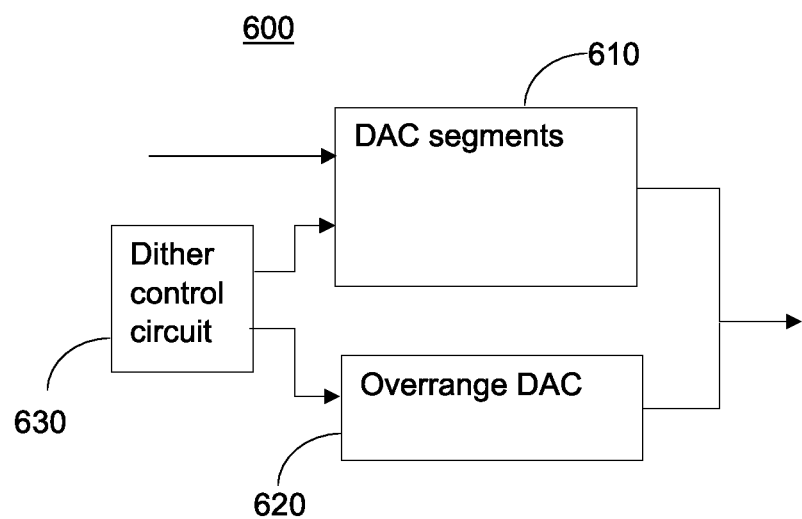
FIG. 6 is a schematic block diagram of a segmented DAC with subtractive dither in accordance with one example.

FIG. 6 is a schematic block diagram of a segmented DAC 600 with subtractive dither in accordance with one example. The segmented DAC 600 includes at least two DAC segments 610, at least one overrange DAC 620, and a dither control circuit 630. The number of DAC segments may be 2, 3, 4, or any positive integer number greater than one. Each DAC segment includes a plurality of DAC cells for generating an analog output signal based on input data to each DAC segment. Each DAC cell has a specific weight. Each segment may be binary-coded or thermometer-coded.

The overrange DAC 620 is configured to generate an analog output signal based on a control signal from the dither control circuit 630 for compensating the dither at the output of the segmented DAC 600 in an analog domain. The overrange DAC 620 may include one or more DAC cells.

The dither control circuit 630 is configured to add a dither (e.g. a random sequence) to the input data supplied to a higher-order DAC segment, and modify the input data supplied to a lower-order DAC segment for compensating the dither. The dither is a signal that is intentionally injected into an input of the DAC 600. The dither may be uncorrelated to the (digital) input signal for better results, e.g., a pseudo-random sequence. The dither control circuit 630 generates the control signal for the overrange DAC 620 for compensating a remaining portion of the dither from an output of the segmented DAC 600 in an analog domain. The dither added to higher-order DAC segment (610) is compensated by modifying the second input data supplied to a lower-order DAC segment (620) and generating the control signal for the overrange DAC (620). An output of the overrange DAC (620) is combined with an output of the segmented DAC (600) in an analog domain.

In some examples, the dither added to the input data may be restricted to a certain range. For example, the dither added to the input data to the higher-order DAC segment may be +1, 0, or −1, or alternatively either +1 or 0, or −1 or 0, (or in general the dither added to the input data to the higher-order DAC segment may be any integer in the range of +M to −M, or alternatively in the range of +M to 0, or −M to 0. In some examples, the portion of the dither subtracted from the input data to the lower-order DAC segment may be a half of the dither added to the input data to the higher-order DAC segment.

In some examples, in order to remove or reduce the correlation of the input data and the dither, the dither may be added to every predetermined number of input samples to the segmented DAC. In some examples, the higher-order DAC segment is thermometer-coded and the lower-order DAC segment is binary-coded.

The dither may be generated based on a random sequence, such as a pseudo-noise (PN) sequence. Alternatively, the random dither may be generated in different ways, which are tailored to the most likely signal statistics and digital back-off situation. Alternatively, the random dither may be dynamically changed while operating the DAC, since the transmit signal statistics or digital back-off is either known or could be extracted in baseband from the transmit data stream with appropriate additional digital intelligence.

With the segmented DAC with subtractive dither in accordance with examples disclosed herein the DAC linearity (e.g. the SFDR) can be improved, especially in deep digital back-off. The dithering scheme is stand-alone and completely transparent to the DAC operation. Therefore, it does not require any direct error measurement or calibration by itself. On the other hand, the dithering scheme can also be employed together with any digital intra-segment switching algorithm (e.g. DEM) and/or DAC calibration.

Figure 7:
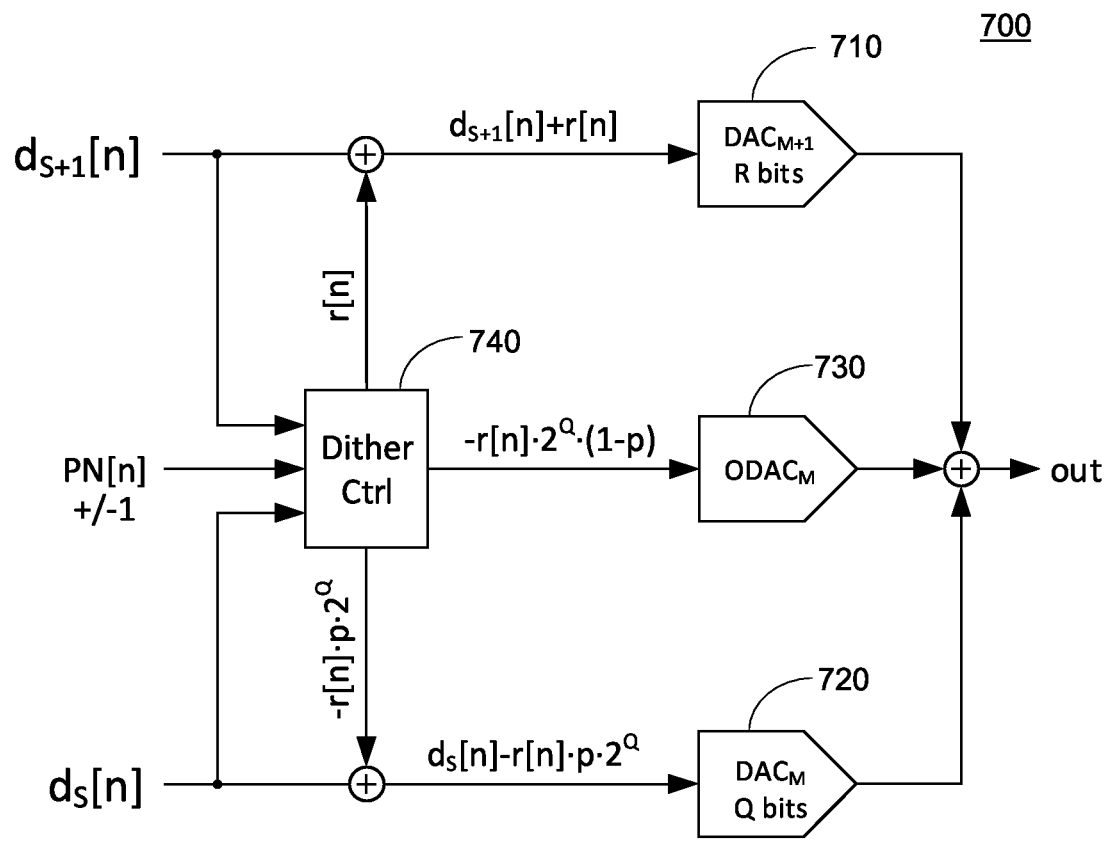
FIG. 7 shows an example 2-segment DAC with subtractive dither in accordance with one example.

FIG. 7 shows an example 2-segment DAC 700 with subtractive dither in accordance with one example. It should be noted that the structure of the segmented DAC 700 in FIG. 7 is merely an example, and the segmented DAC structure can be extended to more than two segments.

The segmented DAC 700 includes an upper segment 710 ($DAC_{M+1}$), a lower segment 720 ($DAC_M$), an overrange DAC 730 ($ODAC_M$), and a dither control circuit 740. Each of the lower segment 720 and the upper segment 710 includes a plurality of DAC cells with a specific weight. The overrange DAC 730 may include at least one DAC cell with a specific weight.

The upper segment 710 resolves R bits (higher-order bits) of the input sample n and the lower segment 720 resolves Q bits (lower-order bits) of the input sample n. Therefore, the smallest unit weight in the upper segment 710 is $2^Q$. For each input sample n, the digital dither control circuit 740 adds a dither r[n] (e.g. a random number) to the digital input data $d_{S+1}[n]$ of the upper segment 710, and at the same time subtracts a multiple p of the scaled dither, $r[n] \cdot p \cdot 2^Q$, from the digital input data $d_S[n]$ of the lower segment 720, where p is a scale factor. A correction value of $r[n] \cdot 2^Q \cdot (1-p)$ needs to be further subtracted to fully cancel the dither added in the digital domain in the upper segment 710. This correction value is generated by the overrange DAC 730 and subtracted from the analog output signal of the segmented DAC 700 in the analog domain. The overrange DAC 730 may be a part of the lower DAC segment 720 or may be separate from the lower DAC segment 720.

The dither r[n] may be generated based on a pseudo-random (PN) sequence. For example, the PN sequence may be generated with a linear feedback shift register (LFSR). The dither r[n] may be a positive integer value, zero, or a negative integer value. If the dither r[n] is zero, no change is made in the digital input data to the DAC segments. Because of the quantization of the lower DAC segment 720, the possible values for the scale factor p may be restricted to values $\{2^{-q}\}$ with q=[1, 2, ... Q]. The number of levels in the overrange DAC 730 is equal to the number of levels in the dither r[n]. The number of output levels that the overrange DAC 730 can produce is equal to the number of levels in the dither r[n]. For example, with one overrange DAC cell in the overrange DAC 730, two output levels (i.e., a positive and a negative of the cell weight) can be produced by the overrange DAC 730.

Dither r[n] may be added if certain conditions are met for the input data. Dither r[n] may be added, if the input data in the upper segment 710 with resolution R and the input data in the lower segment 720 with resolution Q are within the respective valid range, respectively, after the dither is added. The conditions for injecting the dither r[n] are as follows:

$$0 \leq d_{S+1}[n] + r[n] \leq 2^R - 1, \text{ and} \quad \text{Equation (1)}$$

$$0 \leq d_S[n] - r[n] \cdot p \cdot 2^Q \leq 2^Q - 1, \quad \text{Equation (2)}$$

where $d_S[n]$ is the input data to the lower segment and $d_{S+1}[n]$ is the input data to the upper segment, and p is the scale factor.

The dither control circuit 740 checks both Equations (1) and (2) to determine whether dither with a specific polarity and value can be added for a particular input sample n. A small scale factor p allows the addition of a dither value more often, since $d_S[n] - r[n] \cdot p \cdot 2^Q$ will be more likely within the valid range of the lower segment 720 if p is small. However, it also makes the weight of the overrange DAC cells larger. In an extreme case of $p=2^{-Q}$, the dither is subtracted at the LSB-level of the lower segment 720. In this case, the overrange DAC 730 needs to assume the values $r[n] \cdot 2^Q \cdot (1-2^{-Q}) = r[n] \cdot (2^Q - 1)$, i.e. equal to multiples of the entire full-scale value of the lower segment 720.

For a more efficient implementation of the segmented DAC in terms of circuit overhead, the dither r[n] and the scale factor p may be limited to a certain range or values. For example, the dither $r[n] = \{-1, 0, +1\}$ and the scale factor $p = 2^{-1} = 0.5$. More generally, the dither r[n] added to the input data to the higher-order DAC segment may be any integer in the range of +M to −M, or alternatively in the range of +M to 0, or −M to 0.

Figure 8:
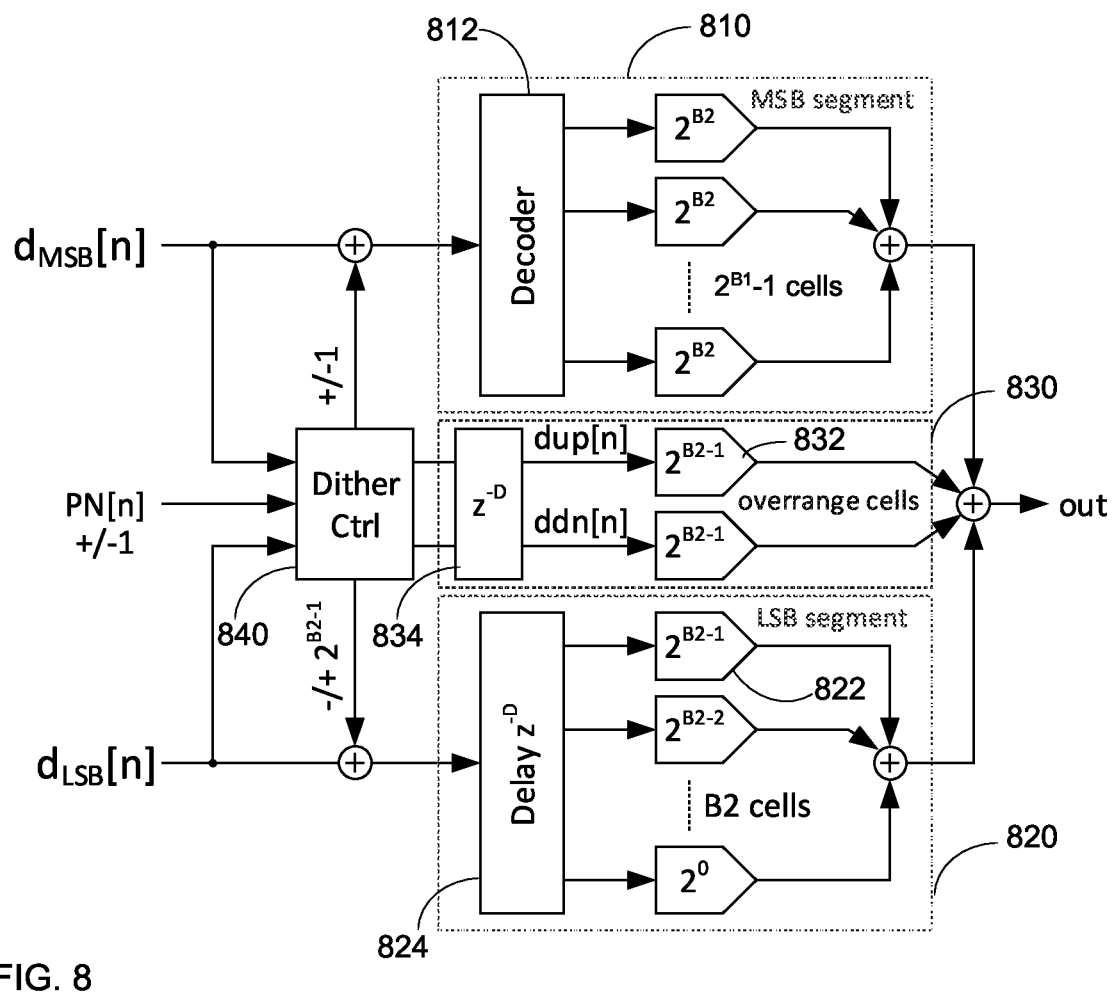
FIG. 8 shows an example 2-segment DAC with the dither r[n]={−1, 0, +1} and the scaling factor p=0.5, using two overrange DAC cells of value $2^{B2-1}$.

FIG. 8 shows an example 2-segment DAC with the dither $r[n] = \{-1, 0, +1\}$ and the scaling factor p=0.5, using two overrange DAC cells of value $2^{B2-1}$. The segmented DAC 800 includes an upper segment 810, a lower segment 820, an overrange DAC 830, and a dither control circuit 840. Each of the lower segment 820 and the upper segment 810 includes a plurality of DAC cells with a specific weight. The overrange DAC 830 includes two DAC cells 832. The upper segment 810 is an MSB segment receiving higher-order digits of the input sample n and the lower segment 820 is an LSB segment receiving lower-order digits of the input sample n. In this example, the lower segment 820 is binary-coded with a resolution of B2 bits. The lower segment 820 includes B2 binary-weighted DAC cells with binary-scaled weights of $2^0$ to $2^{B2-1}$. The upper segment 810 is thermometer-coded with a resolution of B1 bits. The upper segment 810 includes $2^{B1}-1$ equal-sized DAC cells with the same weight of $2^{B2}$. The outputs of the lower segment 820, the upper segment 810, and the overrange DAC 830 are combined as an output of the segmented DAC 800.

For each input sample n, the dither control circuit 840 adds a dither r[n] (−1, 0, or +1) to the digital input data $d_{MSB}[n]$ of the upper segment 810 in the digital domain, and at the same time subtracts a half of the dither value (i.e. $-2^{B2-1}$, 0, or $+2^{B2-1}$) from the digital input data $d_{LSB}[n]$ of the lower segment 820 in the digital domain. A correction value (i.e. the other half of the dither, i.e. $-2^{B2-1}$, 0, or $+2^{B2-1}$) is further subtracted by the overrange DAC 830 from the output of the segmented DAC 800 in the analog domain.

If the lower segment 820 is binary-coded, each of the overrange DAC cells 832 is a copy of the largest DAC cell 822 (i.e. the biggest binary-scaled DAC cell) in the lower segment 820. This can facilitate good matching between the overrange DAC cells 832 and the lower DAC segment 820. The digital operations required in the main (binary) data paths (i.e. performed before the digital decoder 812 (binary-to-thermometer decoding) in the upper segment 810) become very simple. More specifically, the addition of +1 or −1 in the upper segment data $d_{MSB}[n]$ and subtraction of $+/-2^{B2-1}$, (i.e. the half-scale), in the lower segment data $d_{LSB}[n]$ are simple. The latter can be a simple bit inversion of the highest bit in the binary word $d_{LSB}[n]$. Delay units 834, 824 (D clocks, which is the delay of the decoder in the MSB segment) may be included in the overrange DAC 830 and the lower segment 820 for synchronization of the output signals with the upper segment 810 at the output of the segmented DAC 800. Alternatively, the delay unit 834 may be implemented in the dither control circuit 840.

The dither control circuit 840 operates, for example, based on the momentary value of a binary PN sequence PN[n], which may assume two values {0, 1}. In one example, the PN sequence may be generated with a maximum-length linear feedback shift register (LFSR). Alternatively, the random dither r[n] may be generated in different ways, which are tailored to the most likely signal statistics and digital back-off situation. Alternatively, the random dither r[n] may be dynamically changed while operating, since the transmit signal statistic/digital back-off is either known or could be extracted in baseband from the transmit data stream with appropriate additional digital intelligence.

The PN sequence introduces the necessary amount of randomness to decorrelate the dither from the input signal. If, during a particular sample n, the PN sequence assumes the target value that signals dither should be injected, the dither control circuit 840 checks whether the current input data to each DAC segment allows the addition of dither (i.e., whether Equations (1) and (2) above are satisfied). For example, if PN[n] is not just binary values +/−1 but may be 3 levels +1/0/−1, in case of PN[n]=0 no action may be taken for additional randomness. If dither can be injected, the input data to both segments is changed and the input bits (control signal) to the overrange DAC cells are set appropriately. The input data value of $d_{LSB}[n]$ determines which polarity the dither can assume to keep the input data within the valid range (e.g. according to the Equations (1) and (2)). In the example shown in FIG. 8, one of the two polarities is always possible.

Figure 9:
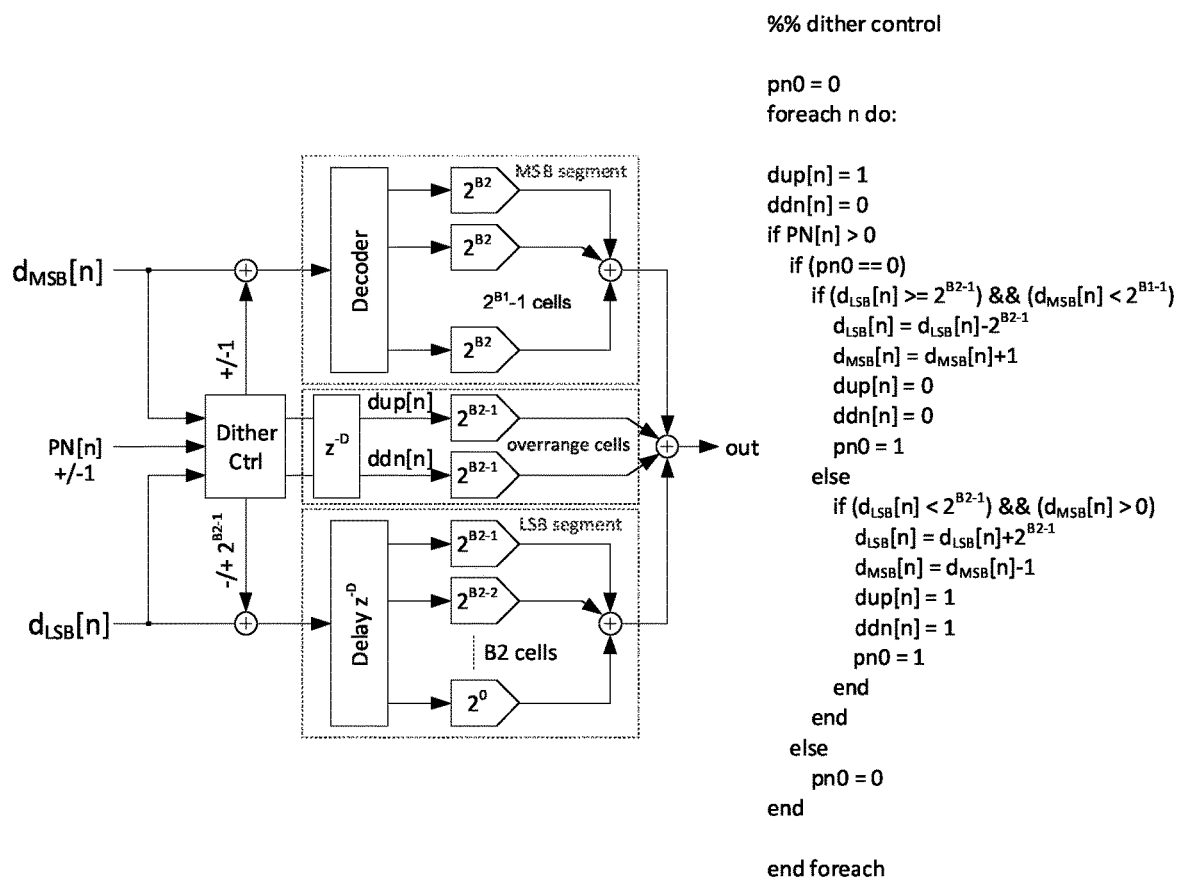
FIG. 9 shows an example algorithm for digital processing to remove any residual correlation between the dither and the input data in case of 2-segment DAC of FIG. 8.

Since the injection/polarity of the dither is still conditional on the input data assuming a certain range of values, there is still a risk of unwanted correlation. Therefore, in some examples, the dither control circuit 840 may perform additional digital processing to remove any residual correlation between the dither and the input data. As an example, FIG. 9 shows an example algorithm for digital processing to remove any residual correlation between the dither and the input data in case of 2-segment DAC of FIG. 8. In this example, even when all the conditions (e.g. Equations (1) and (2)) for injecting the dither are fulfilled, dither may be injected every other input sample, or in general every predetermined number of input samples. This may force an increased dither activity, because if dither is added in sample n, it will be removed during sample n+1 (in case of injecting dither every other input sample), irrespective of the input data and PN[n] conditions. It should be noted that the algorithm in FIG. 9 is only one example and different algorithms may be implemented. The optimum dither algorithm also depends on the signal statistic and the relative dynamic loading of the different segments.

Example operations of the 2-segment DAC will be explained below with reference to FIG. 8. In the examples, it is assumed an 8-bit DAC in 2 segments, with a 4-bit MSB (MSB code range 0 . . . $2^4$−1=0 . . . 15) and a 4-bit LSB (LSB code range 0 . . . 15). In this example, the actual weight of each MSB cell is 16, and the MSB array can assume the (LSB-normalized) values 0, 16, 32 . . . 15×16=240.

Example 1. An input code d[n]=0x33 (HEX)=51 (DEC) is split into $d_{MSB}[n]$=3, $d_{LSB}[n]$=3, output is then $d_{MSB}[n] \times 2^4 + d_{LSB}[n]$=3×16+3=51 (DEC). If 1 bit is subtracted in the MSB code (assuming PN[n]==1) and a half-scale ($2^3$=8) is subtracted in the LSB-code, $d_{MSB}[n]$=2, and $d_{LSB}[n]$=11, which makes a total of $d_{MSB}[n] \times 2^4 + d_{LSB}[n]$=43 (DEC). Now 8 LSB-units are missing to the target code 51 (DEC), which means that 8 LSB-units should be added, equal to the size of the biggest cell in the LSB segment ($2^3$=8). This is done be flipping the appropriate overrange cell with a size of 8 by setting ddn[n]=1 (ddn[n] was equal to 0, which previously canceled with dup[n]=1, because both overrange cells then output an inverse polarity signal of the same size). This rearrangement of cells by exercising the overrange DAC cells can only be done, if $d_{LSB}[n]$<8, otherwise $2^3$=8 cannot be added to the LSB-segment.

Example 2. An input code d[n]=0x19 (HEX)=25 (DEC) is split into $d_{MSB}[n]$=1 and $d_{LSB}[n]$=9, and an output is then $d_{MSB}[n] \times 2^4 + d_{LSB}[n]$=1×16+9=25 (DEC). If 1 bit is added in the MSB code (assuming PN[n]==1) and a half-scale ($2^3$=8) is subtracted in the LSB-code, $d_{MSB}[n]$=2, $d_{LSB}[n]$=1, which makes a total of $d_{MSB}[n] \times 2^4 + d_{LSB}[n]$=33 (DEC). Now, 8 LSB-units are too many compared to the target code 25 (DEC), which means 8 LSB-units should be subtracted, equal to the size of the biggest cell in the LSB segment ($2^3$=8). This is done be flipping the appropriate overrange cell with a size of 8 by setting dup[n]=0 (dup[n] was equal to 1, which previously canceled with ddn[n]=0, because both overrange cells then output an inverse polarity signal of the same size). This rearrangement of cells by exercising the overrange cells can only be done, if $d_{LSB}[n]$>8, otherwise $2^3$=8 cannot be subtracted from the LSB-segment.

Figure 10:
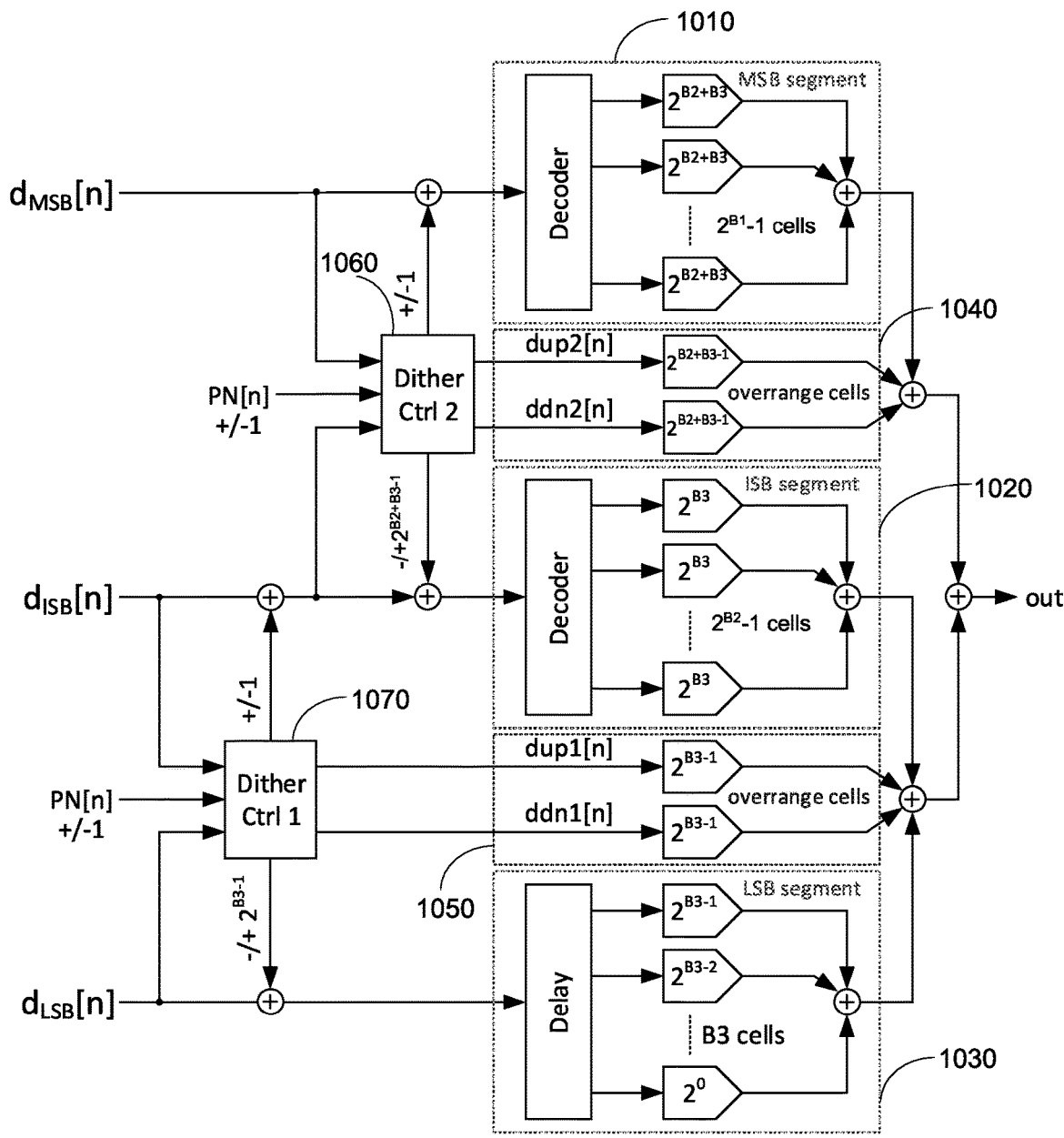
FIGS. 10 and 11 show an example 3-segment DAC with the dither r[n]={−1, 0, +1} and the scaling factor p=0.5.
Figure 11:
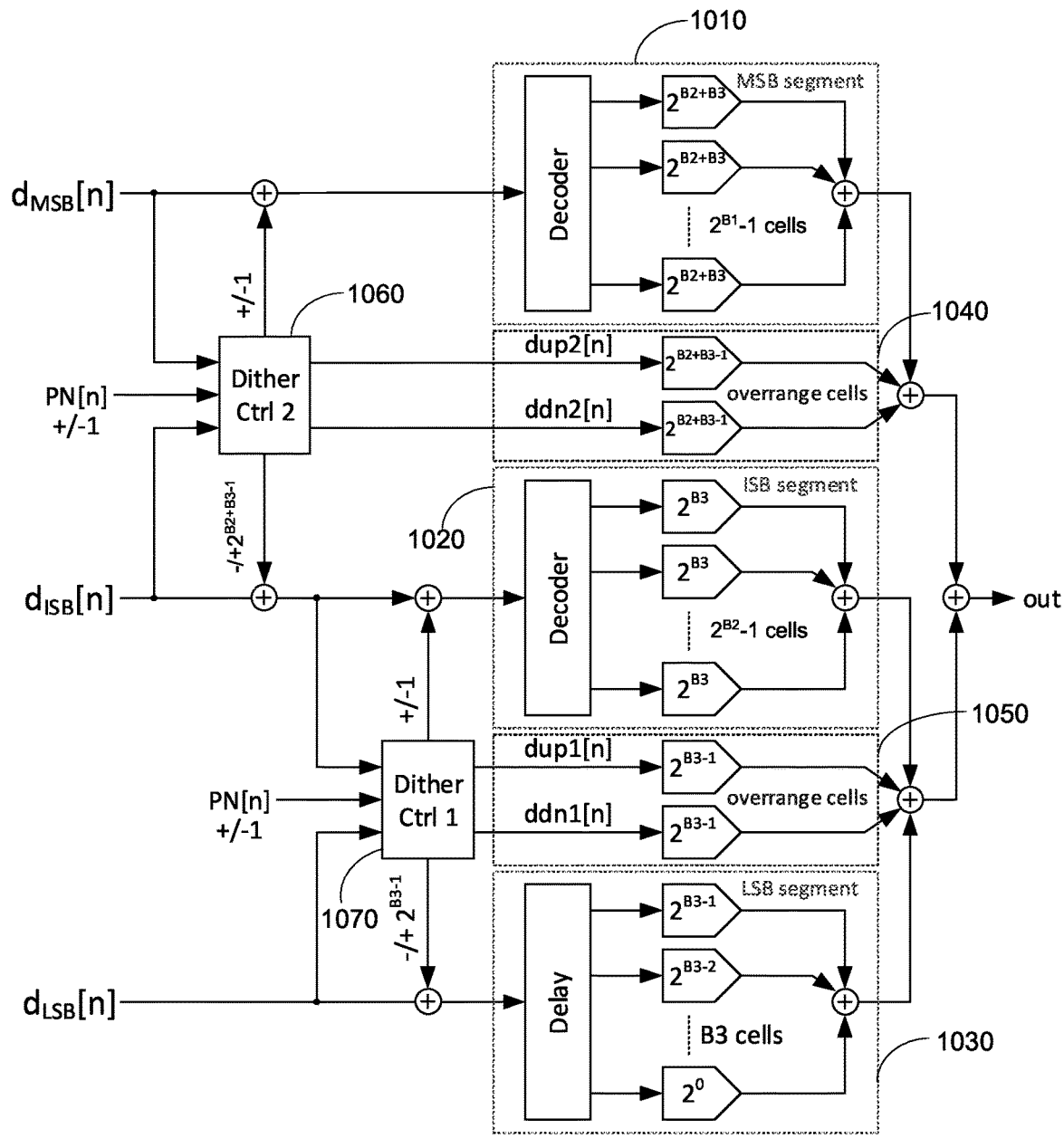

The subtractive dither in accordance with the disclosed examples for a segmented DAC may be extended to more than two segments. FIGS. 10 and 11 show example 3-segment DACs with cascaded dual polarity dither.

FIG. 10 shows an example 3-segment DAC with the dither r[n]={−1, 0, +1} and the scaling factor p=0.5. The segmented DAC 1000 includes an upper segment 1010, a middle segment 1020, a lower segment 1030, two overrange DACs 1040, 1050, and a dither control circuit 1060, 1070. Each of the upper, middle, and lower segments 1010, 1020, 1030 includes a plurality of DAC cells with a specific weight. The upper segment 1010 is an MSB segment receiving higher-order digits of the input sample n, the middle segment 1020 is an ISB segment receiving ISB digits of the input sample n, and the lower segment 1030 is an LSB segment receiving lower-order digits of the input sample n. In this example, the lower segment 1030 is binary-coded with a resolution of B3 bits. The lower segment 1030 includes B3 binary-weighted DAC cells with binary-scaled weights of $2^0$ to $2^{B3-1}$. The middle segment 1020 is thermometer-coded with a resolution of B2 bits. The middle segment 1020 includes $2^{B2}-1$ equal-sized DAC cells with the same weight of $2^{B3}$. The upper segment 1010 is thermometer-coded with a resolution of B1 bits. The upper segment 1010 includes $2^{B1}-1$ equal-sized DAC cells with the same weight of $2^{B2+B3}$. As an alternative, the middle segment 1020 and/or the upper segment 1010 may also be binary-coded. The outputs of the lower segment 1030, the middle segment 1020, the upper segment 1010, and the overrange DACs 1040, 1050 are combined as an output of the segmented DAC 1000.

In the example segmented DAC of FIG. 10, a dither is injected first into the lower two segments 1020, 1030, and if the data conditions in the two upper segments 1010, 1020 remain fulfilled after the lower level dither is injected, dither is injected into the upper two segments 1010, 1020 (bottom-up approach).

For each input sample n, the digital dither control circuit 1070 adds a dither r[n] of −1, 0, +1 to the digital input data $d_{ISB}[n]$ of the middle segment 1020, and at the same time subtracts $-/+2^{B3-1}$ from the digital input data $d_{LSB}[n]$ of the lower segment 1030. A correction value of $-/+2^{B3-1}$ is further subtracted by the overrange DAC 1050 at the output of the segmented DAC 1000 in the analog domain.

After injecting the dither in the middle segment 1020, if the condition for dither injection (e.g. Equations (1) and (2)) for the upper segment 1010 and the middle segment 1020 are satisfied, the digital dither control circuit 1060 adds a dither r[n] of −1, 0, +1 to the digital input data $d_{MSB}[n]$ of the upper segment 1010, and at the same time subtracts $-/+2^{B2+B3-1}$ from the digital input data $d_{ISB}[n]$ of the middle segment 1020. A correction value of $-/+2^{B2+B3-1}$ is further subtracted by the overrange DAC 1040 at the output of the segmented DAC 1000 in the analog domain.

FIG. 11 shows the same 3-segment DAC with the dither r[n]={−1, 0, +1} and the scaling factor p=0.5 as the one shown in FIG. 10. In this example, a dither is injected first into the upper two segments 1010, 1020, and if the data conditions in the two lower segments 1020, 1030 remain fulfilled after the upper level dither is injected, dither is injected into the lower two segments 1020, 1030 (top-down approach).

For each input sample n, the digital dither control circuit 1060 adds a dither r[n] of −1, 0, +1 to the digital input data $d_{MSB}[n]$ of the upper segment 1010, and at the same time subtracts $-/+2^{B2+B3-1}$ from the digital input data $d_{ISB}[n]$ of the middle segment 1020. A correction value of $-/+2^{B2+B3-1}$ is further subtracted by the overrange DAC 1040 at the output of the segmented DAC 1000 in the analog domain.

After injecting the dither in the upper segment 1010, if the condition for dither injection (e.g. Equations (1) and (2)) for the middle segment 1020 and the lower segment 1030 are satisfied, the digital dither control circuit 1070 adds a dither r[n] of −1, 0, +1 to the digital input data $d_{ISB}[n]$ of the middle segment 1020, and at the same time subtracts $-/+2^{B3-1}$ from the digital input data $d_{LSB}[n]$ of the lower segment 1030. A correction value of $-/+2^{B3-1}$ is further subtracted by the overrange DAC 1050 at the output of the segmented DAC 1000 in the analog domain.

In the examples of FIGS. 10 and 11, the delay ($z^{-D}$) required for synchronizing the DAC segments and the overrange DACs may be implemented inside the dither control circuits 1060, 1070.

Figure 12:
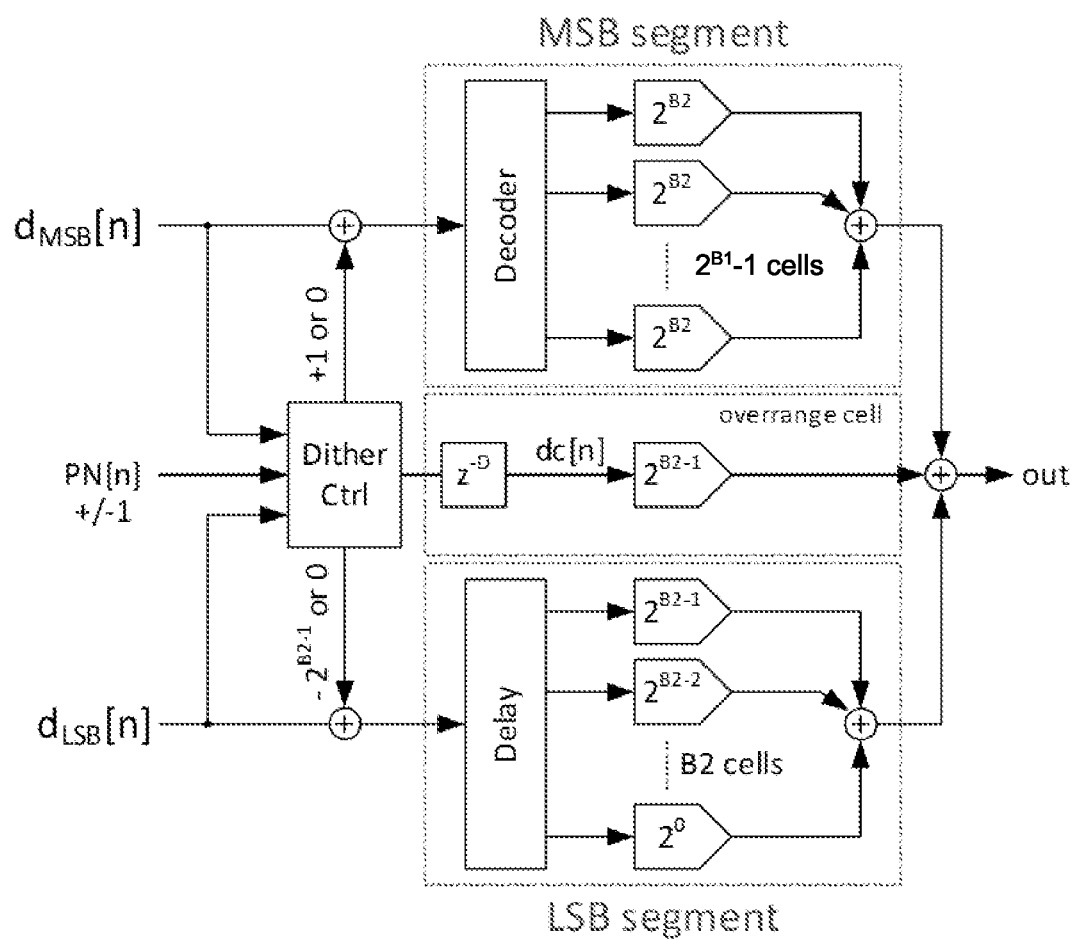
FIG. 12 shows an example 2-segment DAC with single polarity dither.

FIG. 12 shows an example 2-segment DAC 1200 with single polarity dither with a dither r[n]={0, +1} and the scaling factor p=0.5, using a single overrange DAC cell of value $2^{B2-1}$. Alternatively, the dither may be {−1, 0}. An implementation is simpler with a single polarity dither.

The segmented DAC 1200 includes an upper segment 1210, a lower segment 1220, an overrange DAC 1230, and a dither control circuit 1240. Each of the lower segment 1220 and the upper segment 1210 includes a plurality of DAC cells with a specific weight. The overrange DAC 1230 includes a single DAC cell 1232. The upper segment 1210 is an MSB segment receiving higher-order digits of the input sample n and the lower segment 1220 is an LSB segment receiving lower-order digits of the input sample n. In this example, the lower segment 1220 is binary-coded with a resolution of B2 bits. The lower segment 1220 includes B2 binary-weighted DAC cells with binary-scaled weights of $2^0$ to $2^{B2-1}$. The upper segment 1210 is thermometer-coded with a resolution of B1 bits. The upper segment 1210 includes $2^{B1}-1$ equal-sized DAC cells with the same weight of $2^{B2}$. The outputs of the lower segment 1220, the upper segment 1210, and the overrange DAC 1230 are combined as an output of the segmented DAC 1200.

For each input sample n, the digital dither control circuit 1240 adds a dither r[n] of +1 or 0 to the digital input data $d_{MSB}[n]$ of the upper segment 1210, and at the same time subtracts $2^{B2-1}$ or 0 from the digital input data $d_{LSB}[n]$ of the lower segment 1220. A correction value of $2^{B2-1}$ is further subtracted by the overrange DAC 1230 at the output of the segmented DAC 1200 in the analog domain.

Similar to the example disclosed with respect to FIG. 9, the dither control circuit 1240 may perform the additional digital processing to remove any residual correlation between the dither and the input data. As an example, FIG. 13 shows an example algorithm for digital processing to remove any residual correlation between the dither and the input data in case of 2-segment DAC of FIG. 12. In this example, even when all the conditions (e.g. Equations (1) and (2)) for injecting the dither are fulfilled, dither may be injected every other input sample, or in general every predetermined number of input samples. In this example, a single-level dither is added in one polarity (e.g. +1 in the MSB segment is arbitrarily chosen), if the input data and the PN conditions (and any other added processing conditions inside the dither control) are fulfilled. Because one of these conditions are likely to remain unfulfilled (or can be forced to do so) from one input sample to the next, dither is still likely (or can be forced) to be added and then removed from one input sample to the next, in a random fashion due to the conditional query of the pseudo-random sequence PN[n] in each input sample n.

The polarity of the dither may be configured differently. Instead of injecting {+1, 0} into the upper segment 1210, {−1, 0} of dither may be injected into the upper segment 1210 with corresponding sign change in the lower segment 1220 and the overrange DAC cell 1230.

The advantage of this variant is not only that the dither control becomes somewhat simpler (comparing the dither control codes in FIG. 9 and FIG. 13), but also the number of required overrange DAC cells is halved. A potential disadvantage of this simplified dither method is a systematic DC-offset at the output of the DAC, equal to the value of the overrange DAC cell, i.e. half the full-scale range of the lower segment. The polarity of the systematic DC-offset is equal to the chosen polarity of the upper segment dither. Inherently DC-free DACs, such as purely capacitive DACs, as well as DACs that are DC-capable but are ultimately AC-coupled at the output (e.g. current-steering DAC with on-chip resistive termination and transformer-based output matching network) will not experience any disadvantage.

Figure 14:
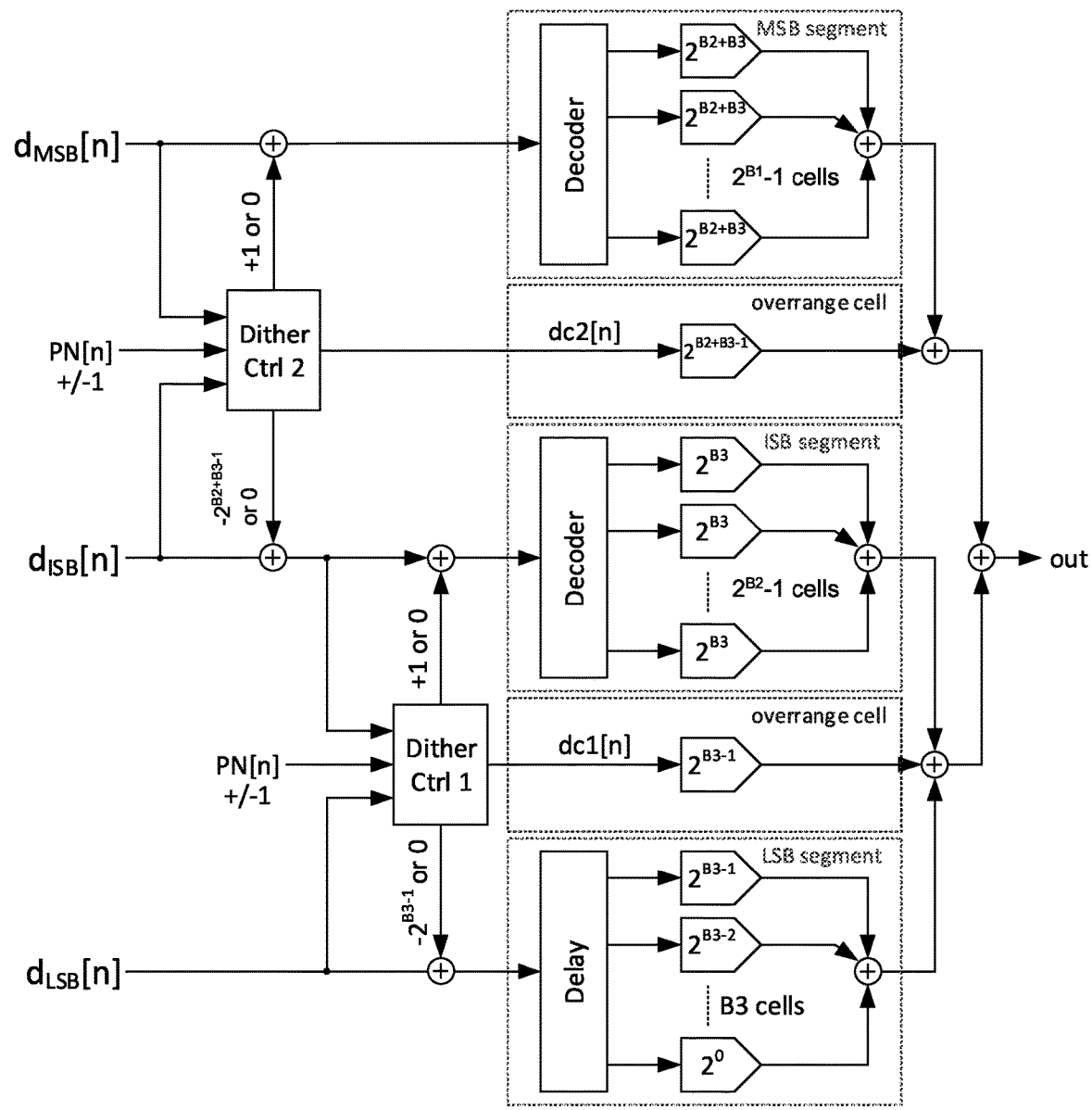
FIG. 14 shows a 3-segment top-down implementation of single-polarity dither injection in accordance with one example.

The example of FIG. 12 can be extended to more than two segments in either order of cascading (top-down or bottom-up). FIG. 14 shows a 3-segment top-down implementation of single-polarity dither injection in accordance with one example. The polarity of the dither is entirely arbitrary. Instead of injecting {+1, 0} into the upper segment, {−1, 0} of dither may be injected into the upper segment with corresponding sign change in the lower segment and the overrange DAC cell. The systematic DC-offset, if present, then changes its polarity.

Figure 15:
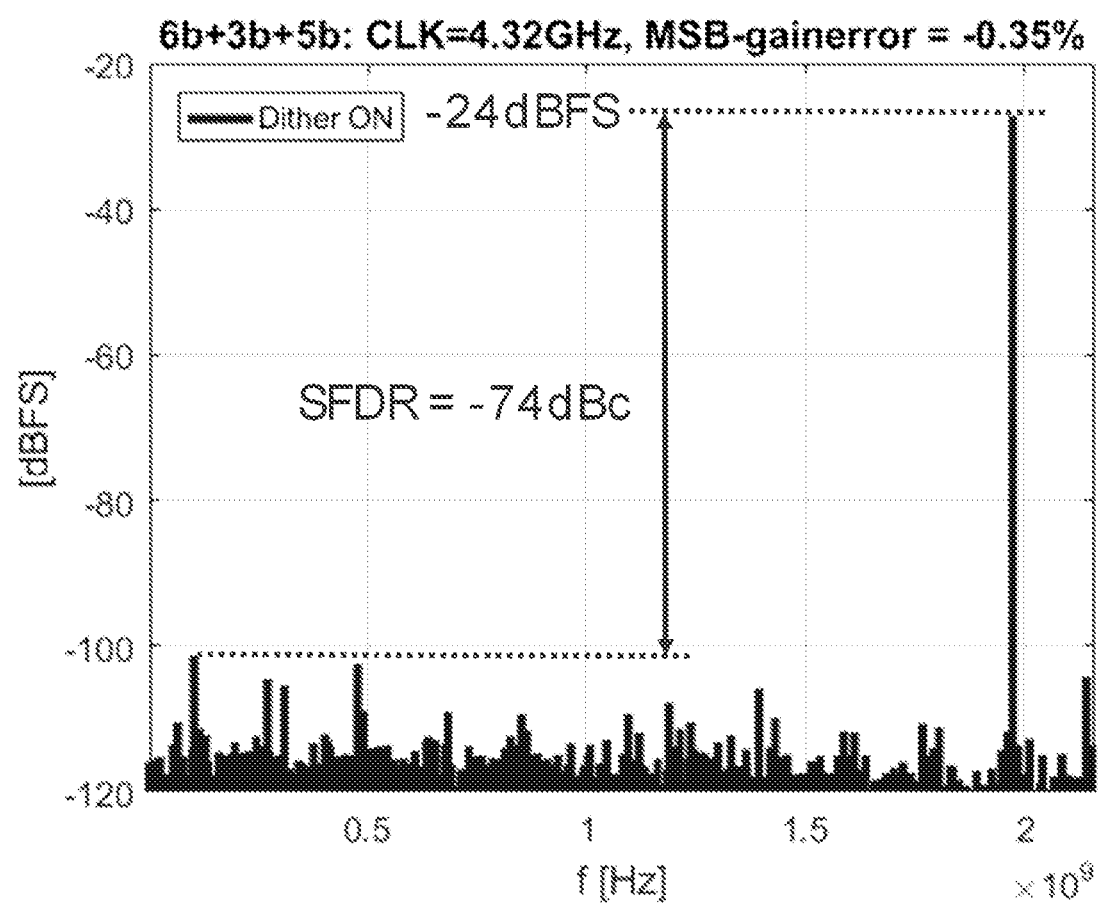
Figure 16:
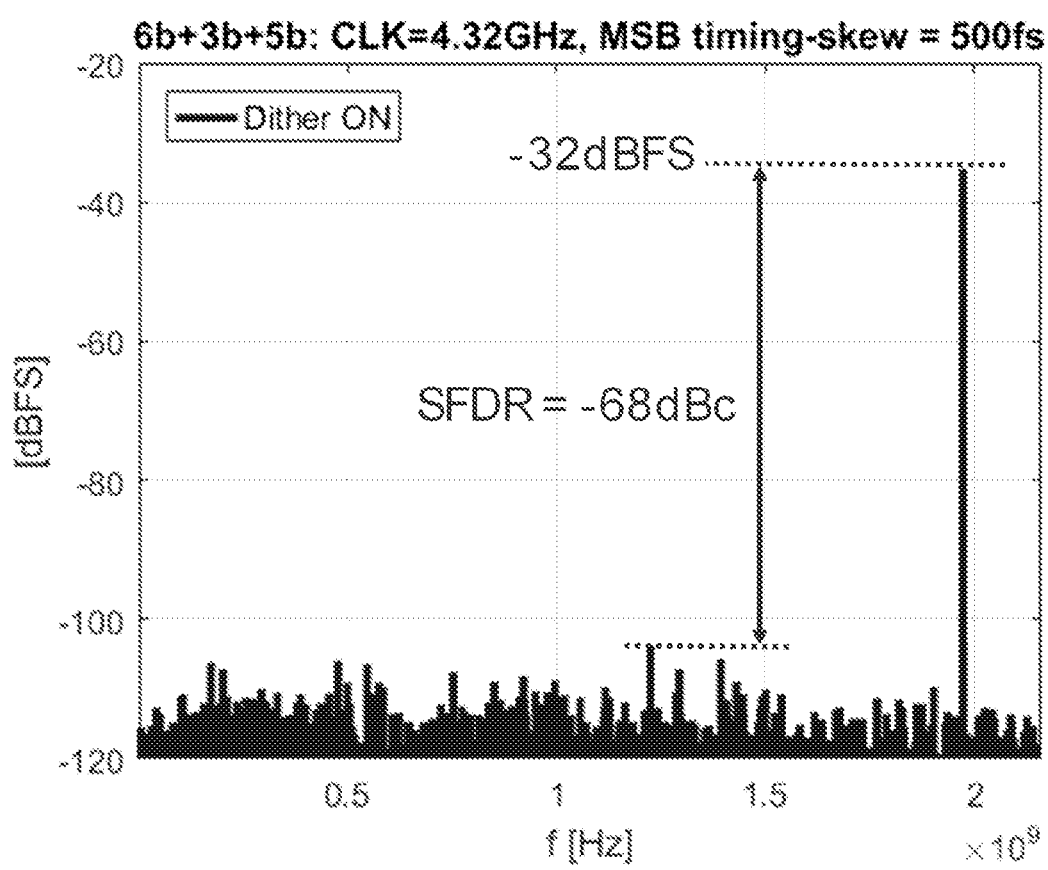
FIG. 16 shows spectrum of single-tone signal with 500 fs MSB timing error and dithering activated.

FIG. 15 shows a single-tone spectrum with −0.35% MSB gain error and dither on. A behavioral simulation example of a high-frequency (0.91·$f_{CLK}$/2) single-tone signal in deep digital back-off (−24 dBFS) for a 3-segment DAC with top-down single-polarity dither injection according to FIG. 14 is shown in FIG. 15. Compared to the simulation result in FIG. 3 for the same DAC the SFDR improvement is 9 dB, without changing the rest of the DAC-core (except for the addition of the overrange DAC cells and the dither control). A similar improvement in small-signal linearity without dither would have required to reduce the inter-segment mismatch by almost a factor 3, which for classical 1/sqrt (area) mismatch effect would mean an area increase by a factor 9. FIG. 16 shows spectrum of single-tone signal with 500 fs MSB timing error and dithering activated. For the same DAC-architecture, FIG. 16 shows the same signal with the same inter-segment error (+500 fs timing skew in MSB-segment) as in FIG. 5, but now with dither active (top-down, single-polarity), the improvement is >10 dB. In both examples the increase in linearity by activating dither is offset by a slight increase in the (quantization) noise floor (1.5-2 dB), an inherent property of error randomization methods.

Figure 17:
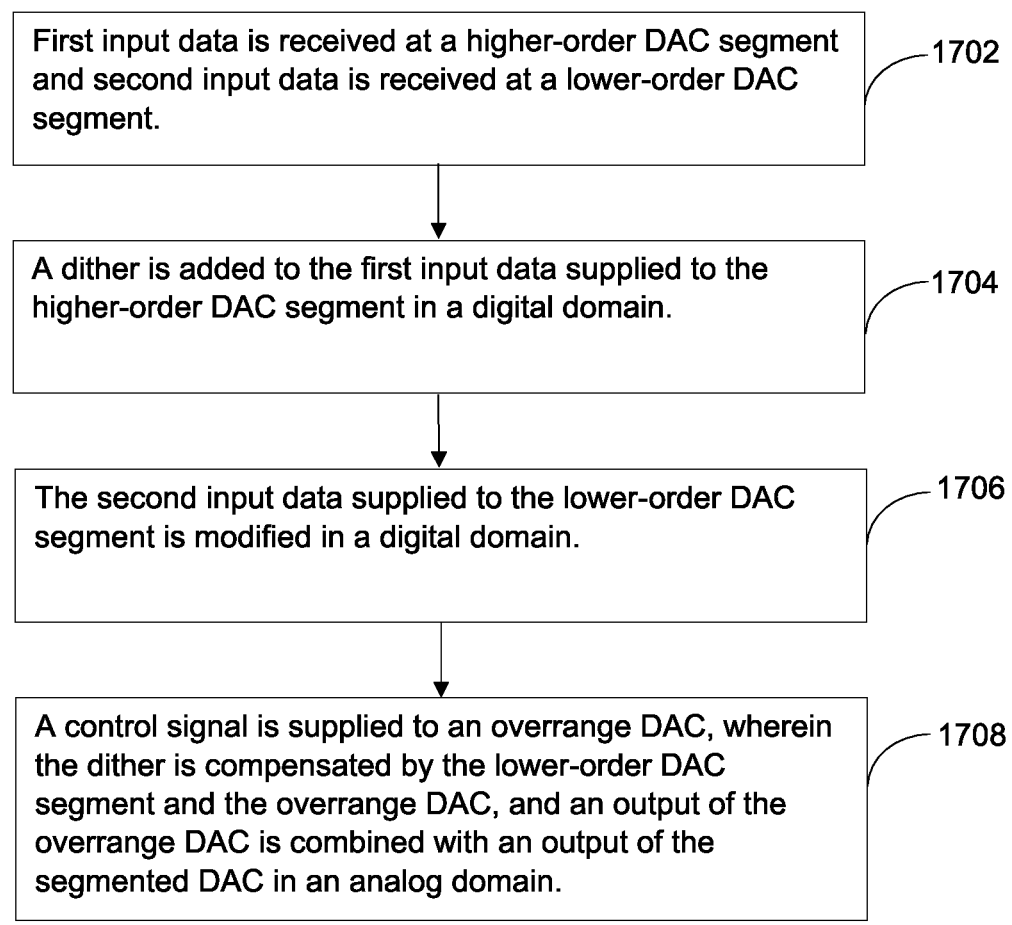
FIG. 17 is a flow diagram of a process for digital-to-analog conversion using a segmented DAC.

FIG. 17 is a flow diagram of a process for digital-to-analog conversion using a segmented DAC. The segmented DAC includes at least two DAC segments, and each DAC segment includes a plurality of DAC cells for generating an analog output signal based on input data to each DAC segment. The segmented DAC includes at least one overrange DAC configured to generate an analog output signal based on a control signal. First input data is received at a higher-order DAC segment and second input data is received at a lower-order DAC segment (1702). A dither is added to the first input data supplied to the higher-order DAC segment in a digital domain (1704). At the same time, the second input data supplied to the lower-order DAC segment is modified in a digital domain (1706). A control signal is supplied to an overrange DAC, wherein the dither is compensated by the lower-order DAC segment and the overrange DAC and an output of the overrange DAC is combined with an output of the segmented DAC in an analog domain (1708).

In some examples, the dither added to the first input data may be +1, 0, or −1 and the portion of the dither subtracted from the second input data may be a half of the dither added to the first input data. Alternatively, the dither added to the first input data may be +1 or 0, or −1 or 0, and the portion of the dither subtracted from the second input data may be a half of the dither added to the first input data. In general, the dither added to the input data to the higher-order DAC segment may be any integer in the range of +M to −M, or alternatively in the range of +M to 0, or −M to 0.

In some examples, the dither may be added to every predetermined number of input samples to the segmented DAC. In some examples, the higher-order DAC segment may be thermometer-coded and the lower-order DAC segment may be binary-coded. The dither may be generated based on a pseudo-random sequence.

In the examples disclosed above, the segmented DACs with subtractive dither use the minimum redundancy for minimum additional analog hardware. Alternatively, more redundancy may be employed. For example, the overrange DAC in the lower segments may be made bigger (e.g. includes additional cells than necessary). Then there are code transitions with adequate cross-segment content that can be dithered with more than one cross-segmental combination of DAC-cells. These input code transitions may be for the dithering method disclosed herein. In this case, the dither control may, always for valid code transitions that can actually be dithered, choose among a set of possible DAC cell combinations. This can either be done randomly (e.g. via random pointer), or by following a deterministic approach (e.g. a deterministic pointer advancement scheme), as well as a combination thereof. In general, with more available redundancy, the linearity performance of a converter can be improved, at the expense of an increase in noise floor.

An example of this alternative scheme is explained with reference to FIG. 8. For example, the overrange DAC 830 may have a bigger range and additionally be built out of smaller cells, e.g., 8 cells with half the weight $2^{B2-2}$. In this case the overrange DAC 830 can cover approximately twice the value range (instead of 1×) of the LSB segment (0 . . . ($2^{B2-1}$) such that it is not necessary to check the data conditions for dither application (Equations (1) and (2) above) because for every possible code in the lower segment 820, the overrange DAC 830 can compensate. This means that dither could now be applied for every input code, because there is more redundancy. By further increasing the overrange DAC range (i.e., even more redundancy), it is possible to allow addition/subtraction more than one unit from the MSB segment 810, i.e., multi-level dither. For example, the dither added to the input data to the higher-order DAC segment may be any integer in the range of +M to −M, or alternatively in the range of +M to 0, or −M to 0. With an overrange DAC of value range [−M . . . +M]× (MSB-cell-size) no data range checking (e.g. Equations (1) and (2) above) is required, but the LSB (or lower segment(s)) may complete the output correctly. Because the sum of the lower segments is almost equal to a single MSB cell (minus one LSB), the overrange DAC needs to cover as a minimum [−(M−½) . . . +(M−½)]×(MSB-cell size). In this case, data range checking needs to be applied, otherwise there would be missing codes for some data values.

In these cases, the distinction between adding/subtracting in one segment and doing the opposite in another segment becomes dither-dependent. The lower segment 820 then assumes the role to "complete" the output signal appropriately to produce the correct output. If the overrange DAC 830 subtracts too much (after a specific code has been added to the MSB segment 810), the lower segment 820 should add the missing output portion and the other way around, and there may or may not be data valid equations to be fulfilled, depending on the code overlap range. In any case, the drawback with adding redundancy is that the overrange DAC grows in total size and/or number of cells, which adds silicon area and power dissipation. Also, the code generation for the lower segment becomes a bit more complicated because it should take into account the actual dither DAC value.

Figure 18:
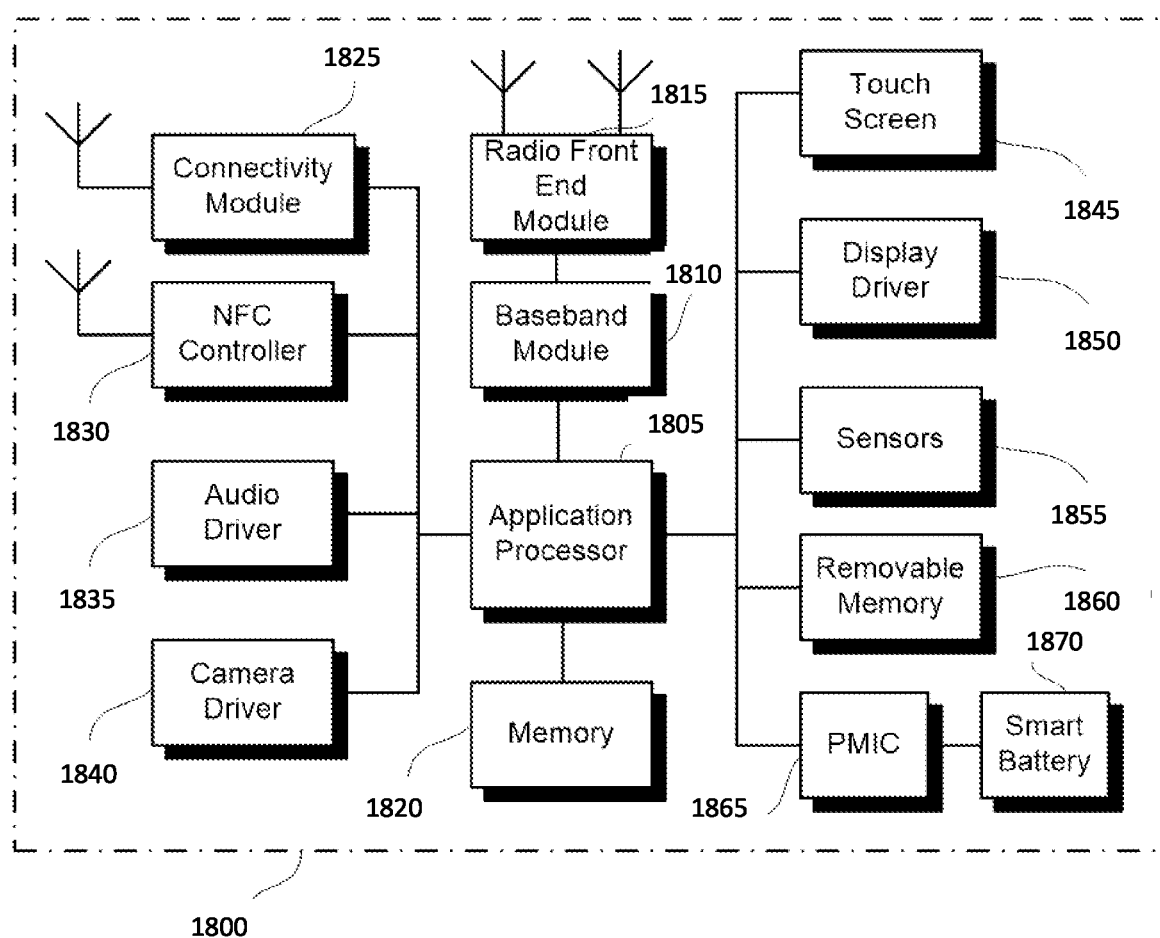
FIG. 18 illustrates a user device in which the examples disclosed herein may be implemented.

FIG. 18 illustrates a user device 1800 in which the examples disclosed herein may be implemented. For example, the examples disclosed herein may be implemented in the radio front-end module 1815, in the baseband module 1810, etc. The user device 1800 may be a mobile device in some aspects and includes an application processor 1805, baseband processor 1810 (also referred to as a baseband module), radio front end module (RFEM) 1815, memory 1820, connectivity module 1825, near field communication (NFC) controller 1830, audio driver 1835, camera driver 1840, touch screen 1845, display driver 1850, sensors 1855, removable memory 1860, power management integrated circuit (PMIC) 1865 and smart battery 1870.

In some aspects, application processor 1805 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1810 may be implemented, for example, as a solder-down substrate including one or more integrated circuits, a single packaged integrated circuit soldered to a main circuit board, and/or a multi-chip module containing two or more integrated circuits.

Figure 19:
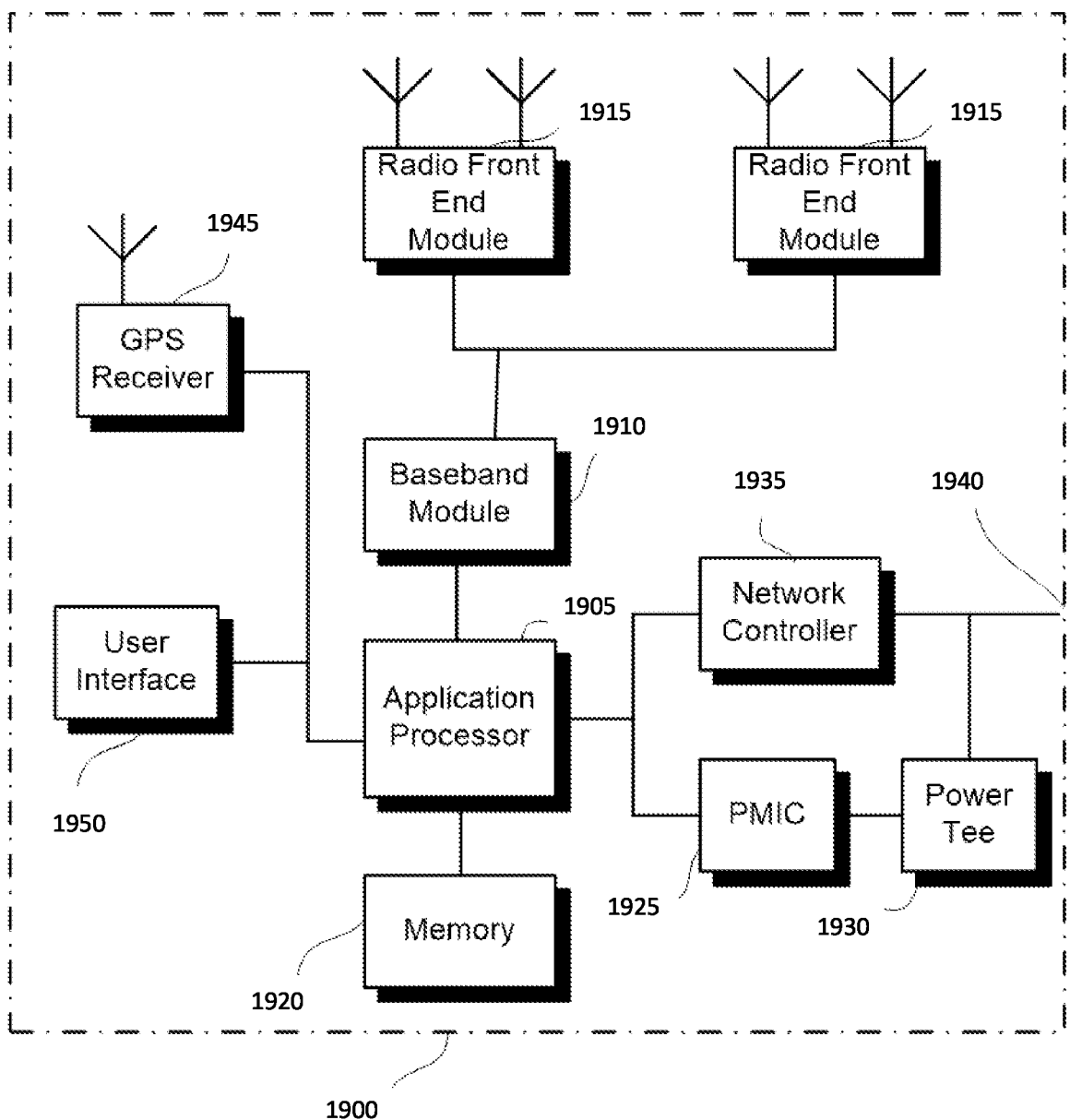
FIG. 19 illustrates a base station or infrastructure equipment radio head in which the examples disclosed herein may be implemented.

FIG. 19 illustrates a base station or infrastructure equipment radio head 1900 in which the examples disclosed herein may be implemented. For example, the examples disclosed herein may be implemented in the radio front-end module 1915, in the baseband module 1910, etc. The base station radio head 1900 may include one or more of application processor 1905, baseband modules 1910, one or more radio front end modules 1915, memory 1920, power management circuitry 1925, power tee circuitry 1930, network controller 1935, network interface connector 1940, satellite navigation receiver module 1945, and user interface 1950.

In some aspects, application processor 1905 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1910 may be implemented, for example, as a solder-down substrate including one or more integrated circuits, a single packaged integrated circuit soldered to a main circuit board or a multi-chip module containing two or more integrated circuits.

In some aspects, memory 1920 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1920 may be implemented as one or more of solder down packaged integrated circuits, socketed memory modules and plug-in memory cards.

In some aspects, power management integrated circuitry 1925 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1930 may provide for electrical power drawn from a network cable to provide both power supply and data connectivity to the base station radio head 1900 using a single cable.

In some aspects, network controller 1935 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1945 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1945 may provide data to application processor 1905 which may include one or more of position data or time data. Application processor 1905 may use time data to synchronize operations with other radio base stations.

In some aspects, user interface 1950 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a segmented DAC. The segmented DAC includes at least two DAC segments, at least one overrange DAC, and a dither control circuit. Each DAC segment includes a plurality of DAC cells for generating an analog output signal based on input data to each DAC segment. The at least one overrange DAC is configured to generate an analog output signal based on a control signal. The dither control circuit is configured to add a dither to first input data supplied to a higher-order DAC segment, compensate the dither by modifying second input data supplied to a lower-order DAC segment and generating the control signal for the overrange DAC. An output of the overrange DAC is combined with an output of the segmented DAC in an analog domain.

Example 2 is the segmented DAC of example 1, wherein the dither added to the first input data is one of +1, 0, and −1, or one of +1 and 0, or −1 and 0 and the portion of the dither subtracted from the second input data is a half of the dither added to the first input data.

Example 3 is the segmented DAC of example 1, wherein the dither added to the first input data is any integer in a range of +M to −M, or +M to 0, or −M to 0.

Example 4 is the segmented DAC as in any one of examples 1-3, wherein the dither is added to every predetermined number of input samples to the segmented DAC.

Example 5 is the segmented DAC as in any one of examples 1-4, wherein the higher-order DAC segment is thermometer-coded and the lower-order DAC segment is binary-coded.

Example 6 is the segmented DAC as in any one of examples 1-5, wherein the dither is generated based on a pseudo-random sequence.

Example 7 is the segmented DAC as in any one of examples 1-6, wherein the segmented DAC includes two DAC segments.

Example 8 is the segmented DAC as in any one of examples 1-6, wherein the segmented DAC includes three DAC segments, two dither control circuits, and two overrange DACs.

Example 9 is the segmented DAC of example 8, wherein a first dither control circuit is configured to add a first dither to input data supplied to a first DAC segment and subtract a portion of the first dither from input data supplied to a second DAC segment, and generate a first control signal for a first overrange DAC for subtracting a remaining portion of the first dither from an output of the segmented DAC in an analog domain, and a second dither control circuit is configured to add a second dither to the second input data supplied to the second DAC segment after subtracting the portion of the first dither from the second input data and subtract a portion of the second dither from a third input data supplied to a third DAC segment, and generate a second control signal for a second overrange DAC for subtracting a remaining portion of the second dither from the output of the segmented DAC in an analog domain, or Example 10 is the segmented DAC of example 8, wherein the second dither control circuit is configured to add the second dither to the second input data supplied to the second DAC segment and subtract a portion of the second dither from the third input data supplied to the third DAC segment and generate the second control signal for the second overrange DAC for subtracting the remaining portion of the second dither from the output of the segmented DAC in an analog domain, and the first dither control circuit is configured to add the first dither to the first input data supplied to the first DAC segment and subtract a portion of the first dither from input data supplied to the second DAC segment after subtracting the portion of the second dither from the second input data, and generate the first control signal for the first overrange DAC for subtracting a remaining portion of the first dither from an output of the segmented DAC in an analog domain.

Example 11 is the segmented DAC as in any one of examples 1-10, wherein the dither control circuit includes a delay unit for synchronizing outputs of the DAC segments and the overrange DAC.

Example 12 is a method for digital-to-analog conversion using a segmented DAC wherein the segmented DAC includes at least two DAC segments, and each DAC segment includes a plurality of DAC cells for generating an analog output signal based on input data to each DAC segment, and the segmented DAC includes at least one overrange DAC configured to generate an analog output signal based on a control signal. The method includes receiving first input data at a higher-order DAC segment and receiving second input data at a lower-order DAC segment, adding a dither to the first input data supplied to the higher-order DAC segment, modifying the second input data supplied to the lower-order DAC segment, and supplying a control signal to an overrange DAC, wherein the dither is compensated by the lower-order DAC segment and the overrange DAC, and an output of the overrange DAC is combined with an output of the segmented DAC in an analog domain.

Example 13 is the method of example 12, wherein the dither added to the first input data is one of +1, 0, and −1, or one of +1 and 0 or −1 and 0 and the portion of the dither subtracted from the second input data is a half of the dither added to the first input data.

Example 14 is the method of example 12, wherein the dither added to the first input data is any integer in a range of +M to −M, or +M to 0, or −M to 0.

Example 15 is the method as in any one of examples 12-14, wherein the dither is added to every predetermined number of input samples to the segmented DAC.

Example 16 is the method as in any one of examples 12-15, wherein the higher-order DAC segment is thermometer-coded and the lower-order DAC segment is binary-coded.

Example 17 is a machine-readable storage including machine readable instructions, when executed, to implement a method as in any one of claims 12-16.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A segmented digital-to-analog converter (DAC), comprising:
   at least two DAC segments, wherein each DAC segment includes a plurality of DAC cells for generating an analog output signal based on input data to each DAC segment;
   at least one overrange DAC configured to generate an analog output signal based on a control signal; and
   a dither control circuit configured to add a dither to first input data supplied to a higher-order DAC segment, and compensate the dither by modifying second input data supplied to a lower-order DAC segment and generating the control signal for the overrange DAC, wherein an output of the overrange DAC is combined with an output of the segmented DAC in an analog domain.

2. The segmented DAC of claim 1, wherein the dither added to the first input data is one of +1, 0, and −1, or one of +1 and 0, or −1 and 0 and the portion of the dither subtracted from the second input data is a half of the dither added to the first input data.

3. The segmented DAC of claim 1, wherein the dither added to the first input data is any integer in a range of +M to −M, or +M to 0, or −M to 0.

4. The segmented DAC of claim 1, wherein the dither is added to every predetermined number of input samples to the segmented DAC.

5. The segmented DAC of claim 1, wherein the higher-order DAC segment is thermometer-coded and the lower-order DAC segment is binary-coded.

6. The segmented DAC of claim 1, wherein the dither is generated based on a pseudo-random sequence.

7. The segmented DAC of claim 1, wherein the segmented DAC includes two DAC segments.

8. The segmented DAC of claim 1, wherein the segmented DAC includes three DAC segments, two dither control circuits, and two overrange DACs,
   wherein a first dither control circuit is configured to add a first dither to input data supplied to a first DAC segment and subtract a portion of the first dither from input data supplied to a second DAC segment, and generate a first control signal for a first overrange DAC for subtracting a remaining portion of the first dither from an output of the segmented DAC in an analog domain, and
   a second dither control circuit is configured to add a second dither to the second input data supplied to the second DAC segment after subtracting the portion of the first dither from the second input data and subtract a portion of the second dither from a third input data supplied to a third DAC segment, and generate a second control signal for a second overrange DAC for subtracting a remaining portion of the second dither from the output of the segmented DAC in an analog domain, or
   wherein the second dither control circuit is configured to add the second dither to the second input data supplied to the second DAC segment and subtract a portion of the second dither from the third input data supplied to the third DAC segment and generate the second control signal for the second overrange DAC for subtracting the remaining portion of the second dither from the output of the segmented DAC in an analog domain, and
   the first dither control circuit is configured to add the first dither to the first input data supplied to the first DAC segment and subtract a portion of the first dither from input data supplied to the second DAC segment after subtracting the portion of the second dither from the second input data, and generate the first control signal for the first overrange DAC for subtracting a remaining portion of the first dither from an output of the segmented DAC in an analog domain.

9. The segmented DAC of claim 1, wherein the dither control circuit includes a delay unit for synchronizing outputs of the DAC segments and the overrange DAC.

10. A method for digital-to-analog conversion using a segmented digital-to-analog converter (DAC), wherein the segmented DAC includes at least two DAC segments, and each DAC segment includes a plurality of DAC cells for generating an analog output signal based on input data to each DAC segment, and the segmented DAC includes at least one overrange DAC configured to generate an analog output signal based on a control signal, the method comprising:
   receiving first input data at a higher-order DAC segment and receiving second input data at a lower-order DAC segment;
   adding a dither to the first input data supplied to the higher-order DAC segment;
   modifying the second input data supplied to the lower-order DAC segment; and
   supplying a control signal to an overrange DAC, wherein the dither is compensated by the lower-order DAC segment and the overrange DAC, and an output of the overrange DAC is combined with an output of the segmented DAC in an analog domain.

11. The method of claim 10, wherein the dither added to the first input data is one of +1, 0, and −1, or one of +1 and 0 or −1 and 0 and the portion of the dither subtracted from the second input data is a half of the dither added to the first input data.

12. The method of claim 10, wherein the dither added to the first input data is any integer in a range of +M to −M, or +M to 0, or −M to 0.

13. The method of claim 10, wherein the dither is added to every predetermined number of input samples to the segmented DAC.

14. The method of claim 10, wherein the higher-order DAC segment is thermometer-coded and the lower-order DAC segment is binary-coded.

15. The method of claim 10, wherein the dither is generated based on a pseudo-random sequence.

16. The method of claim 10, wherein the segmented DAC includes two DAC segments.

17. The method of claim 10, wherein the segmented DAC includes three DAC segments, two dither control circuits, and two overrange DACs.

18. The method of claim 10, further comprising synchronizing outputs of the DAC segments and the overrange DAC.

19. A non-transitory machine-readable storage including machine readable instructions, when executed, to implement a method of claim 10.

* * * * *